US 12,398,283 B2

(12) United States Patent
Sim et al.

(10) Patent No.: US 12,398,283 B2
(45) Date of Patent: Aug. 26, 2025

(54) INK COMPOSITION AND METHOD FOR MANUFACTURING LIGHT EMITTING ELEMENT

(71) Applicant: Samsung Display Co., Ltd., Yongin-si (KR)

(72) Inventors: Junbo Sim, Suwon-si (KR); Dukki Kim, Suwon-si (KR); Sehun Kim, Yongin-si (KR); Hyojin Ko, Seoul (KR); Jaekook Ha, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 858 days.

(21) Appl. No.: 17/445,916

(22) Filed: Aug. 25, 2021

(65) Prior Publication Data

US 2022/0169878 A1 Jun. 2, 2022

(30) Foreign Application Priority Data

Dec. 2, 2020 (KR) .................. 10-2020-0166264

(51) Int. Cl.
*B82Y 20/00* (2011.01)
*C09D 11/36* (2014.01)
*B82Y 40/00* (2011.01)
*H10K 50/115* (2023.01)
*H10K 50/15* (2023.01)
*H10K 50/16* (2023.01)
(Continued)

(52) U.S. Cl.
CPC ............... *C09D 11/36* (2013.01); *B82Y 20/00* (2013.01); *B82Y 40/00* (2013.01); *H10K 50/115* (2023.02); *H10K 50/15* (2023.02); *H10K 50/16* (2023.02); *H10K 71/00* (2023.02); *H10K 71/40* (2023.02); *H10K 2102/331* (2023.02)

(58) Field of Classification Search
CPC ...... H10K 71/00; H10K 50/115; H10K 50/16; H10K 50/15; H10K 2102/331; H10K 71/40; B82Y 20/00; B82Y 40/00; C09D 11/36

See application file for complete search history.

(56) References Cited

U.S. PATENT DOCUMENTS 10,003,037 B2    6/2018  Luchinger et al.
11,926,750 B2    3/2024  Kizaki et al.
(Continued)

FOREIGN PATENT DOCUMENTS

CN    105062193 A    11/2015
CN    109952360 S    6/2019
(Continued)

OTHER PUBLICATIONS

Pan et al—CN105062193, machine translation published on Nov. 18, 2015.*

(Continued)

*Primary Examiner* — Smita S Patel
(74) *Attorney, Agent, or Firm* — Womble Bond Dickinson (US) LLP

(57) ABSTRACT

An ink composition for forming an electron transport region in a light emitting element includes inorganic nanoparticles and a first solvent having a Hansen solubility parameter hydrogen bonding term (δH) value of 5 or less in order to increase dispersion stability of the inorganic nanoparticles, and thereby prevent or reduce nozzle clogging in the head of an inkjet printing device.

7 Claims, 13 Drawing Sheets

(51) Int. Cl.
  *H10K 71/00* (2023.01)
  *H10K 71/40* (2023.01)
  *H10K 102/00* (2023.01)

(56) References Cited

U.S. PATENT DOCUMENTS

| | | | |
|---|---|---|---|
| 2018/0127610 | A1 | 5/2018 | Kido et al. |
| 2018/0230321 | A1 | 8/2018 | Pan et al. |
| 2020/0332138 | A1* | 10/2020 | Yamada ............ C09D 11/38 |
| 2021/0091324 | A1 | 3/2021 | Jung et al. |

FOREIGN PATENT DOCUMENTS

| | | |
|---|---|---|
| CN | 111263794 | 6/2020 |
| JP | 4331927 B2 | 9/2009 |
| JP | 5043319 B2 | 10/2012 |
| JP | 2017002162 | 1/2017 |
| KR | 10-2018-0054249 | 5/2018 |
| KR | 10-2018-0096676 | 8/2018 |
| KR | 10-2120534 B1 | 6/2020 |

OTHER PUBLICATIONS

Wang et al—CN 109952360 A, machine translation, published on Jun. 28, 2019.*
Charles M. Hansen, "*Hansen Solubility Parameters a User's Handbook Second Edition*", CRC Press Taylor & Francis Group, Copyright 2007, 546 pages.
Chinese Examination report issued on Mar. 27, 2024, in corresponding Chinese Patent Application No. 202110973105.5 (9 pages).

* cited by examiner

INK COMPOSITION AND METHOD FOR MANUFACTURING LIGHT EMITTING ELEMENT

CROSS-REFERENCE TO RELATED APPLICATIONS

This application claims priority to and the benefit of Korean Patent Application No. 10-2020-0166264, filed on Dec. 2, 2020, the entire content of which is hereby incorporated by reference.

BACKGROUND

One or more aspects of embodiments of the present disclosure relate to an ink composition, and a method for manufacturing a light emitting element including an electron transport region formed from the ink composition.

Various types (kinds) of display devices are being developed for use in multimedia devices (such as a television set, a mobile phone, a tablet computer, a navigation system, and/or a game console). In such display devices, a so-called self-luminescent display element is used, which accomplishes display by causing an organic light emitting material (e.g., material being or containing organic compound) to emit light.

Quantum dots are being developed as a light emitting material in an effort to enhance the color reproducibility of display devices, and there is a desire to increase the luminous efficiency and/or service life of light emitting elements utilizing quantum dots.

SUMMARY

One or more aspects of embodiments of the present disclosure are directed toward an ink composition having increased dispersion stability.

One or more aspects of embodiments of the present disclosure are directed toward a method for manufacturing a light emitting element having reduced nozzle clogging (e.g., in a head) during an inkjet printing process by applying (utilizing) the ink composition having increased dispersion stability.

One or more embodiments of the present disclosure provide an ink composition including inorganic nanoparticles and a first solvent, wherein the first solvent has a Hansen solubility parameter hydrogen bonding term ($\delta H$) value of 5 or less.

In an embodiment, the ink composition may further include a second solvent, wherein the second solvent contains at least one among triethylene glycol monomethyl ether, propylene glycol, and ethyl alcohol.

In an embodiment, the first solvent and the second solvent may have a volume ratio of about 0.5:1 to about 2:1.

In an embodiment, the inorganic nanoparticles may be contained in an amount of about 0.1 mass % to about 10 mass % with respect to a total amount of 100 mass % of the ink composition.

In an embodiment, the first solvent may include (e.g., contain) diisopropyl phthalate.

In an embodiment, the inorganic nanoparticles may contain at least one among (e.g., at least one selected from the group consisting of) cadmium (Cd), zinc (Zn), indium (In), tin (Sn), antimony (Sb), gallium (Ga), germanium (Ge), arsenic (As), mercury (Hg), nickel (Ni), palladium (Pd), platinum (Pt), cobalt (Co), rhodium (Rh), iridium (Ir), iron (Fe), ruthenium (Ru), osmium (Os), manganese (Mn), molybdenum (Mo), and chromium (Cr).

In an embodiment, the inorganic nanoparticles may each have a diameter (e.g., average diameter or size) of about 1 nm to about 30 nm.

In an embodiment, the ink composition may further include a third solvent, wherein the third solvent may have a Hansen solubility parameter hydrogen bonding term ($\delta H$) value of 5 or less.

In an embodiment, a mixed solvent of the first solvent SV1 and the third solvent SV3 may have a Hansen solubility parameter hydrogen bonding term ($\delta H$) value of 3 or less.

One or more embodiments of the present disclosure provide a method for manufacturing a light emitting element, the method including: forming a hole transport region on a first electrode, forming an emission layer on the hole transport region, forming an electron transport region on the emission layer, and forming a second electrode on the electron transport region, wherein the forming of the electron transport region includes preparing an ink composition containing inorganic nanoparticles and a first solvent, applying the ink composition on the emission layer to form a preliminary electron transport region, and providing heat to the preliminary electron transport region, wherein the first solvent has a Hansen solubility parameter hydrogen bonding term ($\delta H$) value of 5 or less.

In an embodiment, the first solvent may include (e.g., contain) diisopropyl phthalate.

In an embodiment, the preparing of the ink composition includes: dispersing the inorganic nanoparticles in a second solvent to prepare an inorganic nanoparticle dispersion, and mixing the inorganic nanoparticle dispersion with the first solvent, wherein the second solvent has a Hansen solubility parameter hydrogen bonding term ($\delta H$) value greater than 5.

In an embodiment, the second solvent may contain at least one among triethylene glycol monomethyl ether, propylene glycol, and ethyl alcohol.

In an embodiment, the first solvent and the second solvent may have (e.g., be included in) a volume ratio of about 0.5:1 to about 2:1.

In an embodiment, the inorganic nanoparticles may be contained in an amount of about 0.1 mass % to about 10 mass % with respect to a total amount of 100 mass % of the ink composition.

In an embodiment, the ink composition may further include a third solvent, wherein the third solvent may have a Hansen solubility parameter hydrogen bonding term ($\delta H$) value of 5 or less.

In an embodiment, the emission layer may include quantum dots.

In an embodiment, the quantum dots may each include a core and a shell surrounding the core.

In an embodiment, the applying of the ink composition onto the emission layer may be performed utilizing inkjet printing.

In an embodiment, the inorganic nanoparticles may have a diameter of about 1 nm to about 30 nm.

BRIEF DESCRIPTION OF THE FIGURES

The accompanying drawings are included to provide a further understanding of the present disclosure, and are incorporated in and constitute a part of this specification. The drawings illustrate embodiments of the present disclosure and, together with the description, serve to explain principles of the present disclosure. In the drawings.

DETAILED DESCRIPTION

Figure 1:
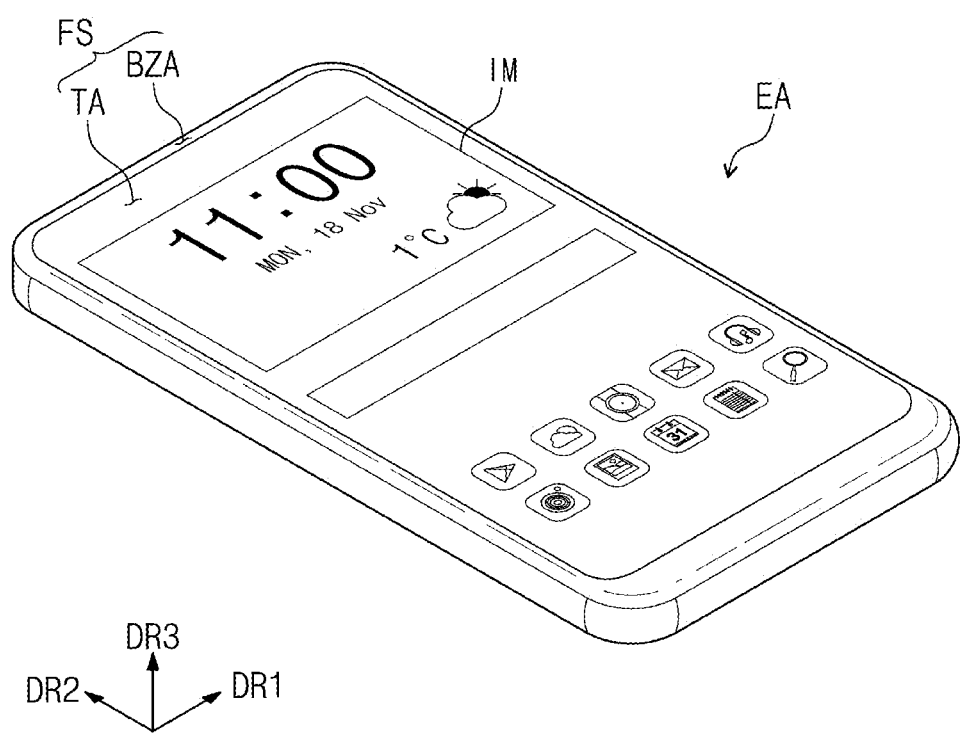
FIG. 1 is a perspective view (e.g., a condensed, joined or combined perspective view) of an electronic device according to an embodiment of the present disclosure.

The present disclosure may be modified in many alternate forms, and thus selected embodiments will be described in the drawings and described in more detail. It should be understood, however, that the present disclosure is not limited to the particular forms disclosed, but rather, is intended to cover all modifications, equivalents, and alternatives falling within the spirit and scope of the present disclosure.

In the present description, when an element (or a region, a layer, a portion, etc.) is referred to as being "on," "connected to," or "coupled to" another element, the element may be directly disposed on/connected to/coupled to the other element, or a third element may be disposed therebetween. When an element is referred to as being "directly on," "directly connected to," or "directly coupled to" another element, there are no intervening elements present.

In the present description, "directly disposed" may indicate that there is no layer, film, region, plate or the like added between the indicated layers, films, regions, plates, and/or the like. For example, "directly disposed" may indicate disposing two layers or two members without additional members (such as an adhesive member) therebetween.

Like reference numerals refer to like elements throughout, and duplicative descriptions thereof may not be provided. Also, in the drawings, thicknesses, ratios, and dimensions of elements may be exaggerated for an effective description of technical contents.

The term "and/or," includes any and all combinations of one or more of the associated listed items. As used herein, expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure".

It will be understood that, although the terms "first", "second", etc. may be used herein to describe one or more suitable elements, these elements should not be limited by these terms. These terms are only used to distinguish one element from another. For example, a first element could be termed a second element, and, similarly, a second element could be termed a first element, without departing from the scope of embodiments of the present disclosure. The terms of a singular form may include plural forms unless the context clearly indicates otherwise.

In some embodiments, terms such as "below," "lower," "above," "upper," and/or the like are used to describe the relationship of the configurations shown in the drawings. The terms are used as relative concepts and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, unless expressly defined herein, and should not be interpreted in an ideal or overly formal sense.

It should be understood that terms such as "include", "comprise", and/or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an ink composition, a light emitting element, and a display device including the same according to an embodiment of the present disclosure will be described with reference to the accompanying drawings.

Figure 2:
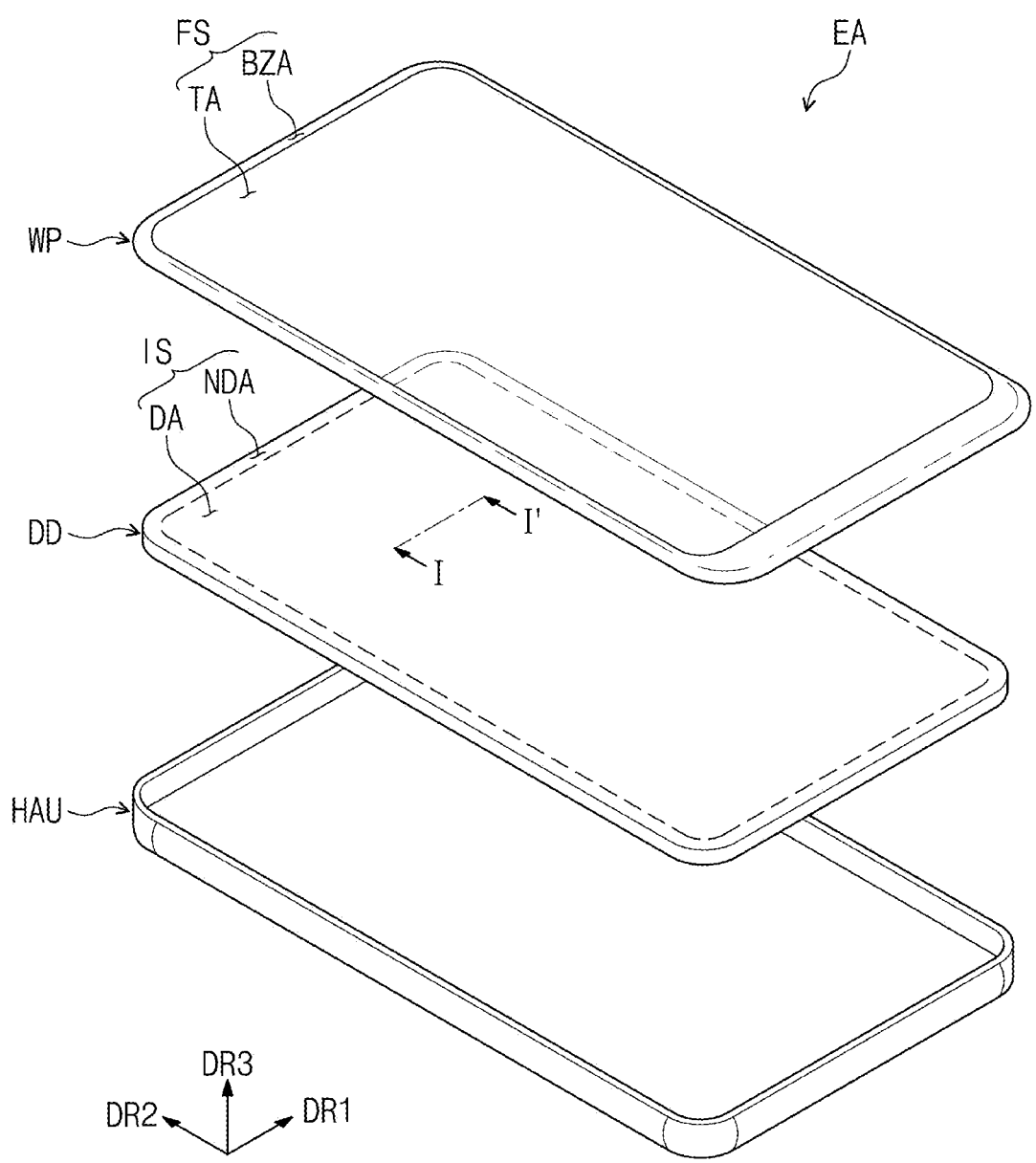
FIG. 2 is an exploded perspective view of an electronic device according to an embodiment of the present disclosure.
Figure 3:
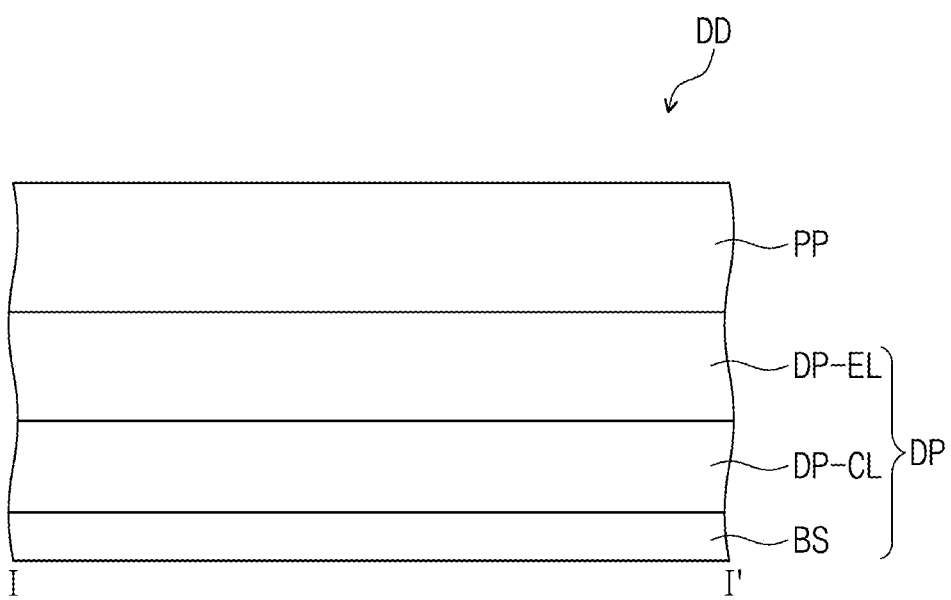
FIG. 3 illustrates a cross-sectional view of a display device according to an embodiment of the present disclosure, which corresponds to line I-I' of FIG. 2.

FIG. 1 is a perspective view illustrating an embodiment of an electronic device EA. FIG. 2 is an exploded perspective view of the electronic device EA of an embodiment. FIG. 3 illustrates a cross-sectional view of a display device according to an embodiment of the present disclosure, which corresponds to line I-I' of FIG. 2.

In an embodiment, the electronic device EA may be a large-sized electronic device (such as a television set, a monitor, and/or an outdoor billboard). In some embodiments, the electronic device EA may be a small- and medium-sized electronic device (such as a personal computer, a laptop computer, a personal digital terminal, a car navigation unit, a game console, a smartphone, a tablet, and/or a camera). These are merely presented as examples, and thus it may be adopted for other electronic devices without departing from the present disclosure. In the present embodiment, the electronic device EA is illustratively shown as a smartphone.

The electronic device EA may include a display device DD and a housing HAU. The display device DD may display an image IM through a display surface IS. FIG. 1 illustrates that the display surface IS parallel to a plane defined by a first direction DR1 and a second direction DR2 crossing the first direction DR1. However, this is presented as an example, and in another embodiment, the display surface IS of the display device DD may have a curved shape.

Among the normal directions of (e.g., directions normal or perpendicular to) display surface IS, that is, the thickness directions of the display device DD, a direction in which the image IM is displayed is indicated by a third direction DR3. A front surface (or an upper surface) and a rear surface (or a lower surface) of respective members may be defined by the third direction DR3 (e.g., the third direction DR3 may be a normal direction to various front and rear surfaces of components in the electronic device EA).

A fourth direction DR4 (see FIG. 4) may be a direction between the first direction DR1 and the second direction DR2. The fourth direction DR4 may be positioned on a plane parallel to the plane (e.g., in the plane) defined by the first direction DR1 and the second direction DR2 (and for example, may be positioned at a non-zero angle with respect to each of the first direction DR1 and the second direction DR2). The directions indicated by the first to fourth directions DR1, DR2, DR3 and DR4 are relative concepts, and may thus be changed to refer to other directions.

The display surface IS on which the image IM is displayed in the electronic device EA may correspond to a front surface of the display device DD and may correspond to a front surface FS of a window WP. Hereinafter, like reference numerals will be used for the display surface and the front surface of the electronic device EA, and the front surface of the window WP. The image IM may include still images as well as dynamic images. In some embodiments, the electronic device EA may include a foldable display device having a folding area and a non-folding area, or a bending display device having at least one bending portion.

The housing HAU may accommodate the display device DD. The housing HAU may be disposed to cover a portion of the display device DD, such that an upper surface, which is the display surface IS of the display device DD, is exposed. For example, the housing HAU may cover a side surface and a bottom surface of the display device DD, and expose the whole upper surface. However, embodiments of the present disclosure are not limited thereto, and in some embodiments the housing HAU may cover a portion of the upper surface as well as the side and bottom surfaces of the display device DD.

In the electronic device EA of an embodiment, the window WP may include an optically transparent insulating material. The window WP may include a transmission area TA and a bezel area BZA. The front surface FS of the window WP including the transmission area TA and the bezel area BZA corresponds to the front surface FS of the electronic device EA. Users may view images provided through the transmission area TA corresponding to the front surface FS of the electronic device EA.

In FIGS. 1 and 2, the transmission area TA is shown as having a rectangular shape with rounded vertices. However, this is presented as an example, and the transmission area TA may have various suitable shapes and is not limited to any one embodiment.

The transmission area TA may be an optically transparent area. The bezel area BZA may be an area having a lower light transmittance relative to the transmission area TA. The bezel area BZA may have a set or predetermined color. The bezel area BZA may be adjacent to the transmission area TA and may be around (e.g., surround) the transmission area TA. The bezel area BZA may define a shape of the transmission area TA. However, embodiments of the present disclosure are not limited thereto, and in some embodiments the bezel area BZA may be disposed adjacent to only one side of the transmission area TA, and a portion thereof may be omitted.

The display device DD may be disposed below the window WP. In the present description, "below" may indicate a direction opposite to the direction in which the display device DD provides an image.

In an embodiment, the display device DD may be substantially configured to generate an image IM. The image IM generated in the display device DD is displayed on the display surface IS, and is viewed by users through the transmission area TA from the outside. The display device DD includes a display area DA and a non-display area NDA. The display area DA may be an area activated in response to electrical signals. The non-display area NDA may be an area covered by the bezel area BZA. The non-display area NDA is adjacent to the display area DA. The non-display area NDA may be around (e.g., surround) the display area DA.

The display device DD may include a display panel DP and an optical member PP disposed on the display panel DP. The display panel DP may include a display element layer DP-EL. The display element layer DP-EL includes a light emitting element ED.

Figure 5:
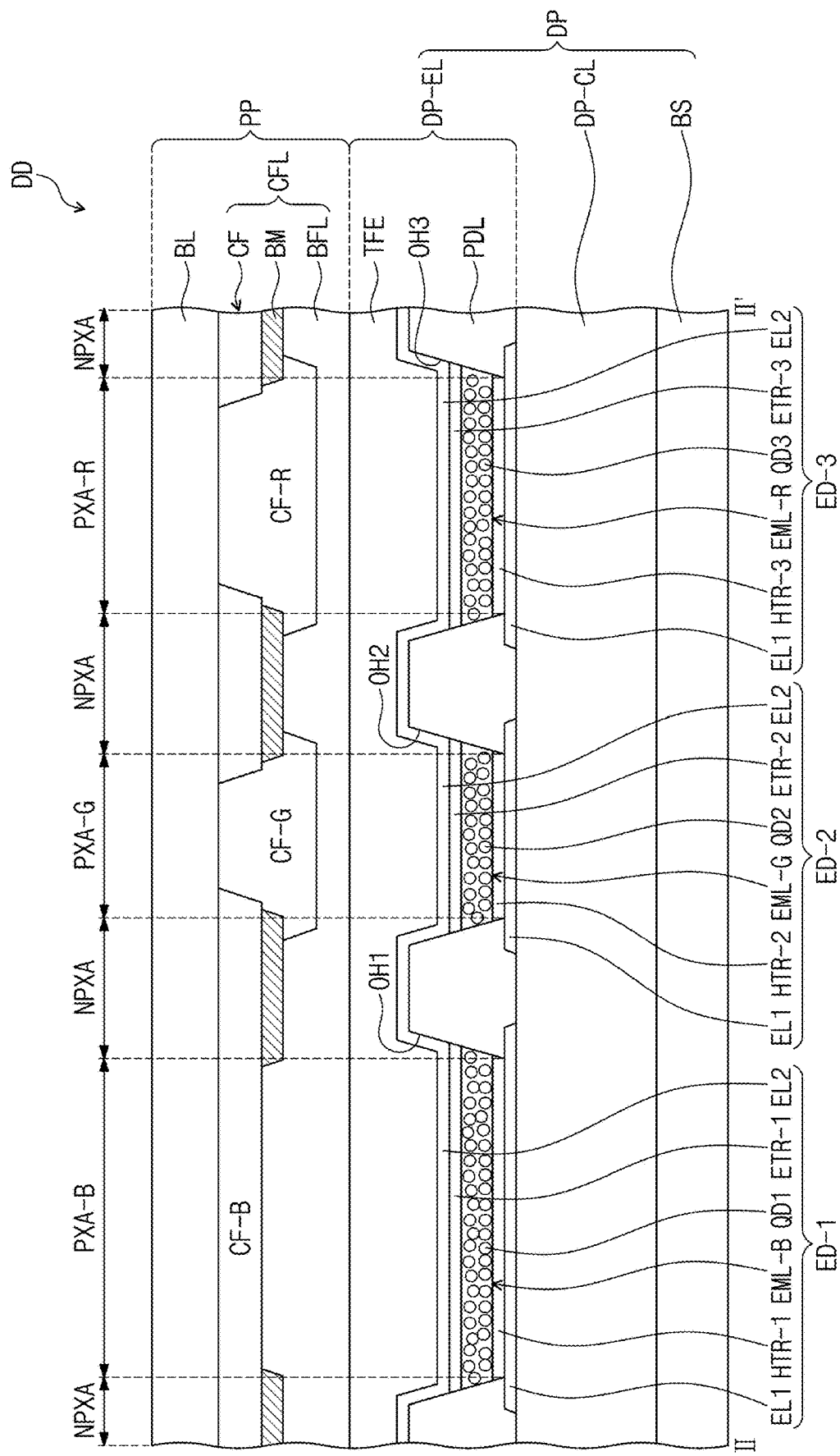
FIG. 5 is a cross-sectional view of a display device according to an embodiment of the present disclosure.

The display device DD may include a plurality of light emitting elements ED-1, ED-2, and ED-3 (see FIG. 5). The optical member PP may be disposed on the display panel DP to control or reduce reflection of external light from the display panel DP. The optical member PP may include, for example, a polarizing layer and/or a color filter layer.

In the display device DD of an embodiment, the display panel DP may be a light emitting display panel. For example, the display panel DP may be a quantum dot light emitting display panel including a quantum dot light emitting element. However, embodiments of the present disclosure are not limited thereto, and the display panel DP may be an organic light emitting display panel including an organic electroluminescence element.

The display panel DP may include a base substrate BS, a circuit layer DP-CL disposed on the base substrate BS, and a display element layer DP-EL disposed on the circuit layer DP-CL.

The base substrate BS may be a member providing a base surface in which the display element layer DP-EL is disposed (e.g., with circuit layer DP-CL therebetween). The base substrate BS may be a glass substrate, a metal substrate, a plastic substrate, etc. However, embodiments of the present disclosure are not limited thereto, and the base substrate BS may be an inorganic layer, an organic layer, or a composite material layer. The base substrate BS may be a flexible substrate that may be readily bent and/or folded.

In an embodiment, the circuit layer DP-CL may be disposed on the base substrate BS, and the circuit layer DP-CL may include a plurality of transistors. For example, the circuit layer DP-CL may include a switching transistor and/or a driving transistor for driving a light emitting element of the display element layer DP-EL.

Figure 4:
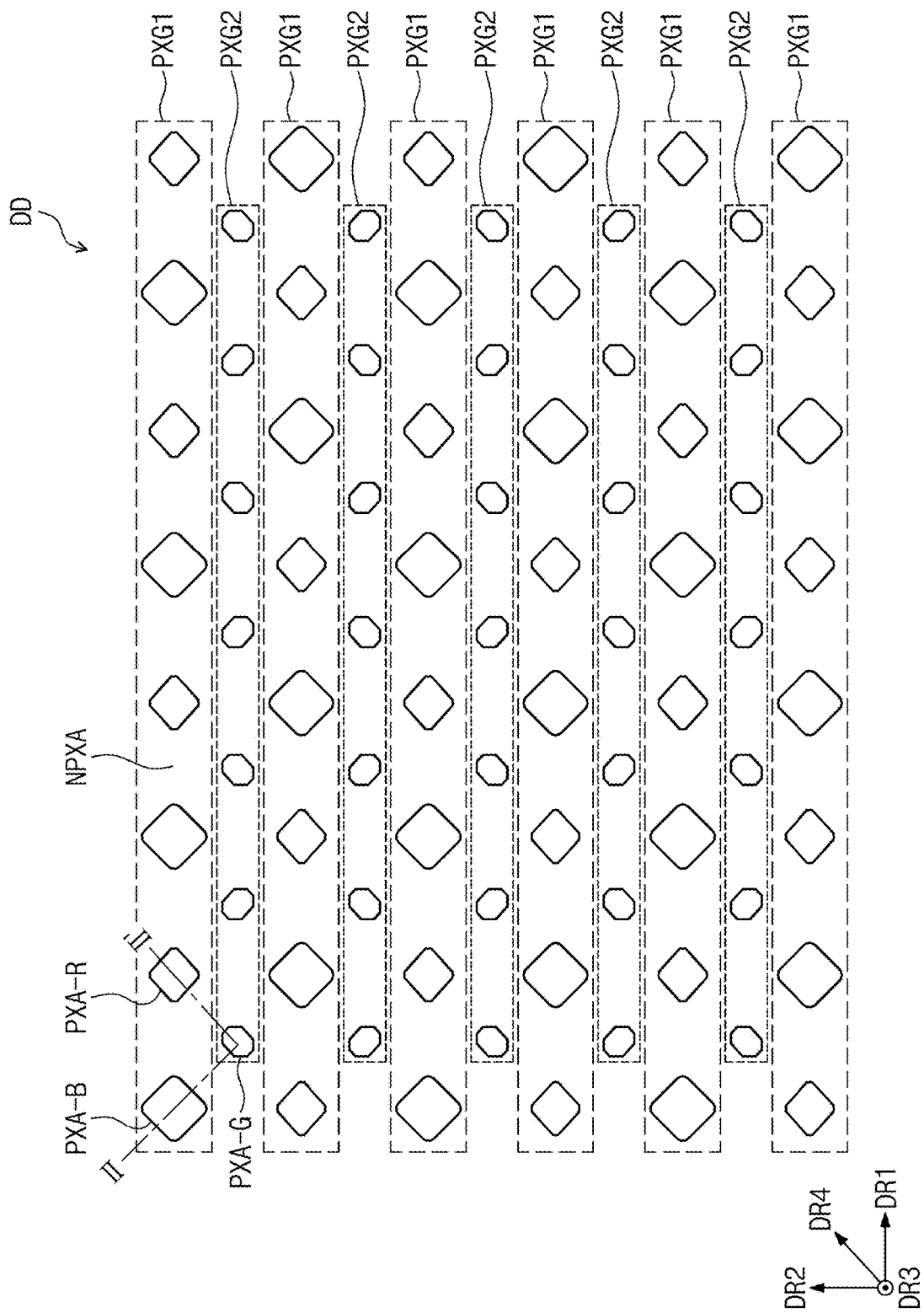
FIG. 4 is a plan view of a display device (pixel layout) according to an embodiment of the present disclosure.

FIG. 4 is a plan view of a display device DD according to an embodiment of the present disclosure. FIG. 5 is a cross-sectional view of a display device DD according to an embodiment. FIG. 5 is a cross-sectional view corresponding to line II-II' of FIG. 4.

Referring to FIGS. 4 and 5, the display device DD of an embodiment includes a plurality of light emitting elements ED-1, ED-2, and ED-3. In some embodiments, the display device DD according to an embodiment may include a display panel DP having a plurality of light emitting elements ED-1, ED-2, and ED-3, and an optical member PP disposed on the display panel DP. In some embodiments, the optical member PP may not be provided in the display device DD of an embodiment.

The display panel DP may include a base substrate BS, and a circuit layer DP-CL and a display element layer DP-EL provided on the base substrate BS, and the display element layer DP-EL may include a pixel defining film PDL, light emitting elements ED-1, ED-2 and ED-3 disposed between portions of (e.g., defined by) the pixel defining film PDL, and an encapsulation layer TFE disposed on the light emitting elements ED-1, ED-2 and ED-3.

The display device DD may include a peripheral area NPXA and a plurality of light emitting areas PXA-B, PXA-G, and PXA-R. The light emitting areas PXA-B, PXA-G, and PXA-R may each be an area emitting light generated from the light emitting elements ED-1, ED-2, and ED-3, respectively. The light emitting areas PXA-B, PXA-G, and PXA-R may be spaced apart from one another on a plane (e.g., in a plan view).

The light emitting areas PXA-B, PXA-G, and PXA-R may be divided into a plurality of groups according to colors of light generated from the light emitting elements ED-1, ED-2, and ED-3. In the display device DD of an embodiment shown in FIGS. 4 and 5, three light emitting areas PXA-B, PXA-G, and PXA-R, which respectively emit blue light, green light, and red light, are illustrated as an example. For example, the display device DD of an embodiment may include a blue light emitting area PXA-B, a green light emitting area PXA-G, and a red light emitting area PXA-R, which are distinct from one another.

The plurality of light emitting elements ED-1, ED-2, and ED-3 may be to emit light having different wavelength ranges. For example, in an embodiment, the display device DD may include a first light emitting element ED-1 emitting blue light, a second light emitting element ED-2 emitting green light, and a third light emitting element ED-3 emitting red light. However, embodiments of the present disclosure are not limited thereto, and the first to third light emitting elements ED-1, ED-2 and ED-3 may be to emit light in the same wavelength range, or may be to emit light in at least one different wavelength range.

For example, the blue light emitting area PXA-B, the green light emitting area PXA-G, and the red light emitting area PXA-R of the display device DD may correspond to the first light emitting element ED-1, the second light emitting element ED-2, and the third light emitting element ED-3, respectively.

The display device DD of an embodiment may include a plurality of light emitting elements ED-1, ED-2, and ED-3, and the light emitting elements ED-1, ED-2, and ED-3 may include emission layers EML-B, EML-G, and EML-R respectively including quantum dots QD1, QD2, and QD3.

The first emission layer EML-B of the first light emitting element ED-1 may include a first quantum dot QD1. The first quantum dot QD1 may be to emit blue light as a first light. The second emission layer EML-G of the second light emitting element ED-2 and the third emission layer EML-R of the third light emitting element ED-3 may include a second quantum dot QD2 and a third quantum dot QD3, respectively. The second quantum dot QD2 and the third quantum dot QD3 may be to emit green light as a second light and red light as a third light, respectively.

In an embodiment, the first light may be light having a central wavelength in a wavelength range of about 410 nm to about 480 nm, the second light may be light having a central wavelength in a wavelength range of about 500 nm to about 570 nm, and the third light may be light having a central wavelength in a wavelength range of about 625 nm to about 675 nm.

The quantum dots QD1, QD2, and QD3 included in the emission layer EML of an embodiment may each be a semiconductor nanocrystal that may be selected from a Group II-VI compound, a Group III-V compound, a Group IV-VI compound, a Group IV element, a Group IV compound, and combinations thereof.

The Group II-VI compound may be selected from the group consisting of: a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from the group consisting of ZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

The Group III-VI compound may include a binary compound (such as $In_2S_3$ and/or $In_2Se_3$), a ternary compound (such as $InGaS_3$ and/or $InGaSe_3$), or any combination thereof.

The Group I-III-VI compound may include a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and mixtures thereof, or a quaternary compound (such as $AgInGaS_2$ and/or $CuInGaS_2$).

The Group III-V compound may be selected from the group consisting of: a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the Group III-V compound may further include a Group II metal. For example, InZnP, etc. may be selected as a Group III-II-V compound.

The Group IV-VI compound may be selected from the group consisting of: a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The Group IV element may be selected from the group consisting of Si, Ge, and a mixture thereof. The Group IV compound may be a binary compound selected from the group consisting of SiC, SiGe, and a mixture thereof.

The binary compounds, ternary compounds, and/or quaternary compounds may each be present in particles in a substantially uniform concentration distribution, or may be present in particles in a partially different (e.g., non-uniform) concentration distribution. In some embodiments, a core/shell structure may be present, in which one quantum dot (e.g., a shell) effectively surrounds another quantum dot (e.g., a core) An interface between the core and the shell may have a concentration gradient, in which the concentration of an element present in the shell becomes lower towards the center.

In some embodiments, the quantum dots QD1, QD2, and QD3 may each have a core/shell structure including a core having nano-crystals, and a shell surrounding the core, as described above. The shells of the quantum dots QD1, QD2, and QD3 may each serve as a protection layer to prevent or reduce the chemical deformation of each core to maintain its semiconductor properties, and/or may serve as a charging layer to impart electrophoresis (electrophoretic) properties to inorganic nanoparticles. The shell may be a single layer or may have multiple layers. An interface between the core and the shell may have a concentration gradient in which the concentration of an element present in the shell becomes lower towards the center. The shells of the quantum dots QD1, QD2, and QD3 may each be or include, for example, a metal or non-metal oxide, a semiconductor compound, or a combination thereof.

For example, the metal or non-metal oxide may be a binary compound (such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO), or a ternary compound (such as $MgAl_2O_4$, $CoFe_2O_4$, $NiFe_2O_4$, and/or $CoMn_2O_4$), but embodiments of the present disclosure are not limited thereto.

In some embodiments, the semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments of the present disclosure are not limited thereto.

The quantum dots QD1, QD2, and QD3 may each have a full width of half maximum (FWHM) of a light emission wavelength spectrum of about 45 nm or less, about 40 nm or less, or about 30 nm or less, and color purity or color reproducibility may be enhanced in the above ranges. In some embodiments, light emitted through (by) the quantum dots QD1, QD2, and QD3 may be emitted in all directions, and thus a wide viewing angle may be improved.

The forms of the quantum dots QD1, QD2, and QD3 are not particularly limited, and may be any form available in the related art, for example, a quantum dot in the form of spherical, pyramidal, multi-arm, or cubic nanoparticles, nanotubes, nanowires, nanofibers, nanoparticles, etc.

The quantum dots QD1, QD2, and QD3 may control the colors of emitted light according to the particle size (e.g., diameter) thereof (e.g., may emit light having a color that his determined by the particle size), and thus the quantum dots QD1, QD2, and QD3 may provide various suitable light emitting colors such as blue, red, green, etc. The smaller the particle size of the quantum dots QD1, QD2, and QD3, the shorter the wavelength region of the emitted light. For example, in the quantum dots QD1, QD2, and QD3 having the same core, the particle size of the quantum dot to emit green light may be smaller than the particle size of the quantum dot to emit red light. For example, in the quantum dots QD1, QD2, and QD3 having the same core, the particle size of the quantum dot to emit blue light may be smaller than the particle size of the quantum dot to emit green light. However, embodiments of the present disclosure are not limited thereto, and even when the quantum dots QD1, QD2, and QD3 have the same core, the particle size may be controlled or selected according to thickness and formation materials of the shell.

In some embodiments, when the quantum dots QD1, QD2, and QD3 have various (e.g., different) light emitting colors (such as blue, red, green, etc.), the quantum dots QD1, QD2, and QD3 having different light emitting colors may have different core materials.

In an embodiment, the first to third quantum dots QD1, QD2, and QD3 may have different diameters. For example, the first quantum dot QD1 utilized in the first light emitting element ED-1 to emit light in relatively short wavelength ranges may have a comparatively smaller average diameter than the second quantum dot QD2 of the second light emitting element ED-2 and the third quantum dot QD3 of the third light emitting element ED-3, each being to emit light in relatively long wavelength ranges.

In the present description, the term "average diameter" refers to an arithmetic mean of the diameters of a plurality of quantum dot particles. In some embodiments, the diameter of the quantum dot particles may be an average value of the cross-sectional width of the quantum dot particles.

The relationships between the average diameters of the first to third quantum dots QD1, QD2 and QD3 are not limited to the above description. FIG. 5 illustrates an embodiment in which the sizes of the first to third quantum dots QD1, QD2, and QD3 are about the same, but in some embodiments, the sizes of the first to third quantum dots QD1, QD2, and QD3 included in the light emitting elements ED-1, ED-2, and ED-3 may be different from one another. In some embodiments, the average diameter of two quantum dots selected from the first to third quantum dots QD1, QD2, and QD3 may be similar, and the rest (other) may be different.

In the light emitting elements ED-1, ED-2, and ED-3 of an embodiment, the emission layers EML-B, EML-G, and EML-R may include a host and a dopant. In an embodiment, the emission layers EML-B, EML-G, and EML-R may include the quantum dots QD1, QD2, and QD3 as a dopant material. In some embodiments, in an embodiment, the emission layers EML-B, EML-G, and EML-R may further include a host material. In some embodiments, in the light emitting elements ED-1, ED-2, and ED-3 of an embodiment, the emission layers EML-B, EML-G, and EML-R may be to emit fluorescence. For example, the quantum dots QD1, QD2, and QD3 may be utilized as a fluorescent dopant material.

In some embodiments, the first to third quantum dots QD1, QD2, and QD3 may each have a ligand bonded on quantum dot surfaces (e.g., an outer surface) thereof for improving dispersibility.

In the display device DD of an embodiment, as shown in FIGS. 4 and 5, each of the light emitting areas PXA-B, PXA-G and PXA-R may be different in planar size (e.g., area) from one another. In this case, the term "area" may refer to an area when viewed on (e.g., normal to) a plane defined by the first direction DR1 and the second direction DR2 (e.g., in a plan view).

The light emitting areas PXA-B, PXA-G and PXA-R may have differently sized areas according to the colors emitted from the emission layers EML-B, EML-G, and EML-R of the light emitting elements ED-1, ED-2 and ED-3. For example, referring to FIGS. 4 and 5, the blue light emitting area PXA-B corresponding to the first light emitting element ED-1 to emit blue light may have a largest area, and the green light emitting area PXA-G corresponding to the second light emitting element ED-2 to emit green light may have a smallest area in the display device DD of an embodiment. However, embodiments of the present disclosure are not limited thereto, and the light emitting areas PXA-B, PXA-G and PXA-R may be to emit light other than blue light, green light and red light, or the light emitting areas PXA-B, PXA-G and PXA-R may have the same size/area, or the light emitting areas PXA-B, PXA-G, and PXA-R may be provided at area ratios different from those shown in FIG. 4.

Each of the light emitting areas PXA-B, PXA-G and PXA-R may be separated by a pixel defining film PDL. The non-light emitting areas NPXA may be areas between neighboring light emitting areas PXA-B, PXA-G and PXA-R, and may correspond to the pixel defining film PDL. In some embodiments, in the present description, each of the light emitting areas PXA-B, PXA-G and PXA-R may correspond to a pixel. The pixel defining film PDL may separate the light emitting elements ED-1, ED-2 and ED-3. The emission layers EML-B, EML-G, and EML-R of the light emitting elements ED-1, ED-2 and ED-3 may be disposed in openings (e.g., OH1, OH2, and OH3) defined by the pixel defining film PDL and separated from each other. In an embodiment, the first emission layer EML-B of the first light emitting element ED-1 may be disposed in a first opening OH1, and the second emission layer EML-G of the second light emitting element ED-2 may be disposed in a second opening OH2, and the third emission layer EML-R of the third light emitting element ED-3 may be disposed in a third opening OH3.

The pixel defining film PDL may be formed of a polymer resin. For example, the pixel defining film PDL may be formed including a polyacrylate-based resin and/or a polyimide-based resin. In some embodiments, the pixel defining film PDL may be formed by further including an inorganic material in addition to the polymer resin. In some embodiments, the pixel defining film PDL may be formed by including a light absorbing material, or may be formed by including a black pigment and/or a black dye. The pixel defining film PDL formed by including a black pigment and/or a black dye may implement a black pixel defining film. When forming the pixel defining film PDL, carbon black may be utilized as a black pigment and/or a black dye, but embodiments of the present disclosure are not limited thereto.

In some embodiments, the pixel defining film PDL may be formed of an inorganic material. For example, the pixel defining film PDL may be formed to include silicon nitride ($SiN_x$), silicon oxide ($SiO_x$), silicon oxynitride ($SiO_xN_y$), etc. The pixel defining film PDL may define the light emitting areas PXA-B, PXA-G, and PXA-R. The light emitting areas PXA-B, PXA-G, and PXA-R may be separated by the pixel defining film PDL, and the non-light emitting area NPXA may correspond to the pixel defining film PDL.

The light emitting elements ED-1, ED-2, and ED-3 may include a first electrode EL1, hole transport regions HTR-1, HTR-2, and HTR-3 disposed on the first electrode EL1, emission layers EML-B, EML-G, and EML-R disposed on the hole transport regions HTR-1, HTR-2, and HTR-3, electron transport regions ETR-1, ETR-2, and ETR-3 disposed on the emission layers EML-B, EML-G, and EML-R, and a second electrode EL2 disposed on the electron transport regions ETR-1, ETR-2, and ETR-3.

The hole transport regions HTR-1, HTR-2, and HTR-3 and the electron transport regions ETR-1, ETR-2, and ETR-3 respectively included in each of the light emitting elements ED-1, ED-2, and ED-3 may be separated by being disposed in the openings OH1, OH2, and OH3 defined in the pixel defining film PDL.

For example, the first hole transport region HTR-1 and the first electron transport region ETR-1 included in the first light emitting element ED-1 may be disposed adjacent to the first emission layer EML-B, and may be patterned and disposed in the first opening OH1 in which the first emission layer EML-B is disposed. The second hole transport region HTR-2 and the second electron transport region ETR-2 included in the second light emitting element ED-2 may be disposed adjacent to the second emission layer EML-G, and may be patterned and disposed in the second opening OH2 in which the second emission layer EML-G is disposed. The third hole transport region HTR-3 and the third electron transport region ETR-3 included in the third light emitting element EMD-3 may be disposed adjacent to the third emission layer EML-R, and may be patterned and disposed in the third opening OH3 in which the third emission layer EML-G is disposed. However, embodiments of the present disclosure are not limited thereto, and the hole transport regions HTR-1, HTR-2, and HTR-3 and the electron transport regions ETR-1, ETR-2, and ETR-3 may be provided as a common layer (e.g., as common layers) commonly disposed in pixel areas PXA-B, PXA-G, and PXA-R and the peripheral area NPXA.

In an embodiment, the hole transport regions HTR-1, HTR-2, and HTR-3 and the electron transport regions ETR-1, ETR-2, and ETR-3 may each be provided in the openings OH1, OH2, and OH3 defined in the pixel defining film PDL through a printing process.

An encapsulation layer TFE may cover the light emitting elements ED-1, ED-2 and ED-3. The encapsulation layer TFE may seal the display element layer DP-EL. The encapsulation layer TFE may be a thin film encapsulation layer. The encapsulation layer TFE may be a single layer or a laminated layer of a plurality of layers. The encapsulation layer TFE includes at least one insulating layer. The encapsulation layer TFE according to an embodiment may include at least one inorganic film (hereinafter, an encapsulation inorganic film). In some embodiments, the encapsulation layer TFE according to an embodiment may include at least one organic film (hereinafter, an encapsulation organic film) and at least one encapsulation inorganic film.

The encapsulation inorganic film protects the display element layer DP-EL from moisture/oxygen, and the encapsulation organic film protects the display element layer DP-EL from foreign substances (such as dust particles). The encapsulation inorganic film may include a silicon nitride layer, a silicon oxynitride layer, a silicon oxide layer, a titanium oxide layer, an aluminum oxide layer, etc., but embodiments are not limited thereto. The encapsulation organic layer may include an acrylic-based compound, an epoxy-based compound, etc. The encapsulation organic layer may include a photopolymerizable compound, and is not particularly limited.

The encapsulation layer TFE may be disposed on the second electrode EL2, and may be disposed to fill the openings OH1, OH2, and OH3.

In the display device DD of an embodiment illustrated in FIG. 5, the thicknesses of the emission layers EML-B, EML-G, and EML-R of the first to third light emitting elements ED-1, ED-2, and ED-3 are illustrated as being similar to one another, but embodiments are not limited thereto. For example, in an embodiment, the thicknesses of the emission layers EML-B, EML-G, and EML-R of the first to third light emitting elements ED-1, ED-2, and ED-3 may be different from one another. In some embodiments, the thicknesses of the hole transport regions HTR-1, HTR-2, and HTR-3 and electron transport regions ETR-1 and ETR-2 and ETR-3 of the first to third light emitting elements ED-1, ED-2, and ED-3 may also be different from each other.

Referring to FIG. 4, the blue light emitting areas PXA-B and the red light emitting areas PXA-R may be alternatingly arranged with each other along the first direction DR1 to form a first group PXG1. The green light emitting areas PXA-G may be arranged with each other along the first direction DR1 to form a second group PXG2.

The first group PXG1 and the second group PXG2 may be spaced apart from each other in the second direction DR2. Each of the first group PXG1 and the second group PXG2 may be provided in plurality. The first groups PXG1 and the second groups PXG2 may be alternately arranged with each other in the second direction DR2.

One green light emitting area PXA-G may be disposed spaced apart from one blue light emitting area PXA-B or one red light emitting area PXA-R in the fourth direction DR4. The fourth direction DR4 may be a direction between the first direction DR1 and the second direction DR2, as described above.

The arrangement structure of the light emitting areas PXA-B, PXA-G and PXA-R shown in FIG. 4 may have or be a PENTILE® structure or diamond structure. However, an arrangement structure of the light emitting areas PXA-B, PXA-G and PXA-R in the display device DD according to an embodiment is not limited to the arrangement structure shown in FIG. 4. For example, in an embodiment, the light emitting areas PXA-B, PXA-G and PXA-R may have a stripe structure (in which the blue light emitting area PXA-B, the green light emitting area PXA-G, and the red light emitting area PXA-R may be alternatingly arranged with each other along the first direction DR1).

Referring to FIGS. 3 and 5, the display device DD of an embodiment may further include an optical member PP. The optical member PP may block or reduce external light incident to the display panel DP from outside of the display device DD. The optical member PP may block or reduce some of the external light. The optical member PP may provide an anti-reflection function to minimize or reduce reflection of external light.

In the embodiment illustrated in FIG. 5, the optical member PP may include a color filter layer CFL. For example, the display device DD of an embodiment may further include the color filter layer CFL disposed on the light emitting elements ED-1, ED-2, and ED-3 of the display panel DP.

In the display device DD of an embodiment, the optical member PP may include a base layer BL and a color filter layer CFL.

The base layer BL may be a member providing a base surface on (e.g., under) which the color filter layer CFL is disposed. The base layer BL may be a glass substrate, a metal substrate, a plastic substrate, etc. However, embodiments of the present disclosure are not limited thereto, and the base layer BL may be an inorganic layer, an organic layer, or a composite material layer.

The color filter layer CFL may include a light blocking unit BM and a color filter CF. The color filter CF may include a plurality of filters CF-B, CF-G, and CF-R. For example, the color filter layer CFL may include a first filter CF-B transmitting the first color light, a second filter CF-G transmitting the second color light, and a third filter CF-R transmitting the third color light. For example, the first filter CF-B may be a blue filter, the second filter CF-G may be a green filter, and the third filter CF-R may be a red filter.

Each of the filters CF-B, CF-G, and CF-R may include a polymer photosensitive resin and a pigment and/or a dye. The first filter CF-B may include a blue pigment and/or a blue dye, the second filter CF-G may include a green pigment and/or a green dye, and the third filter CF-R may include a red pigment and/or a red dye.

Embodiments of the present disclosure are not limited thereto, and in some embodiments the first filter CF-B may not include a pigment or a dye. For example, the first filter CF-B may include a polymer photosensitive resin, but not include a pigment or a dye. The first filter CF-B may be transparent. The first filter CF-B may be formed of a transparent photosensitive resin.

The light blocking unit BM may be a black matrix. The light blocking unit BM may be formed including an organic light blocking material or an inorganic light blocking material, which may both be or include a black pigment or a black dye. The light blocking unit BM may prevent or reduce light leakage, and separate boundaries between the adjacent filters CF-B, CF-G, and CF-R.

The color filter layer CFL may further include a buffer layer BFL. For example, the buffer layer BFL may be a protective layer protecting the filters CF-B, CF-G, and CF-R. The buffer layer BFL may be an inorganic material layer including at least one inorganic material among (e.g., at least one inorganic material selected from the group consisting of) silicon nitride, silicon oxide, and silicon oxynitride. The buffer layer BFL may be formed of a single layer or a plurality of layers.

In an embodiment shown in FIG. 5, the first color filter CF-B of the color filter layer CFL is illustrated to partially overlap the second filter CF-G and the third filter CF-R, but embodiments of the present disclosure are not limited thereto. In some embodiments, for example, the first to third filters CF-B, CF-G and CF-R may be separated by the light blocking unit BM and may not overlap one another. In some embodiments, each of the first to third filters CF-B, CF-G and CF-R may be disposed to respectively correspond to the blue light emitting area PXA-B, the green light emitting area PXA-G, and the red light emitting area PXA-R.

In some embodiments, the display device DD of an embodiment may include a polarizing layer as the optical member PP instead of the color filter layer CFL. The polarizing layer may block or reduce external light provided to (e.g., incident on) the display panel DP from the outside. The polarizing layer may block or reduce some of the external light.

In some embodiments, the polarizing layer may reduce reflected light generated in the display panel DP due to external light. For example, the polarizing layer may serve to block or reduce reflected light when light provided from the outside the display device DD is incident to the display panel DP and exits again. The polarizing layer may be a circular polarizer having an anti-reflection function, or the polarizing layer may include a linear polarizer and a λ/4 phase retarder. The polarizing layer may be disposed on over the base layer BL to be exposed (e.g., on the surface of the display device DD), or the polarizing layer may be disposed below the base layer BL.

FIGS. 6 to 9 are cross-sectional views of a light emitting element according to an embodiment of the present disclosure.

Figure 6:
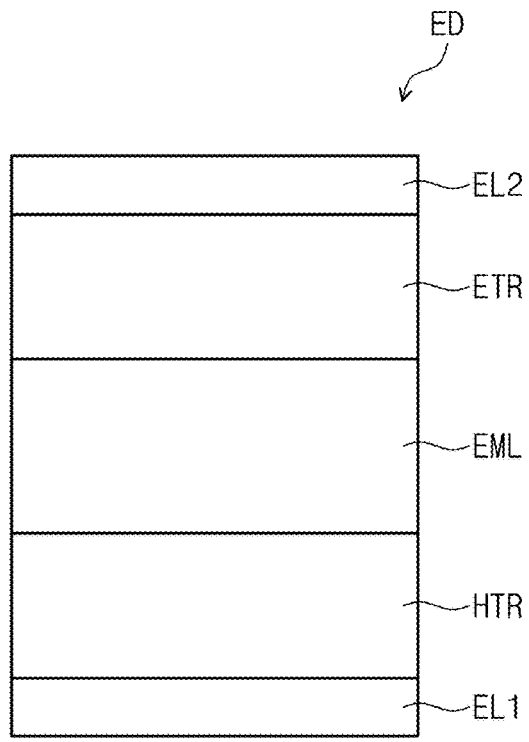
FIGS. 6 to 9 are cross-sectional views of a light emitting element according to an embodiment of the present disclosure.

Referring to FIG. 6, the light emitting element ED according to an embodiment may include a first electrode EL1, a hole transport region HTR, an emission layer EML, an electron transport region ETR, and a second electrode EL2.

Figure 7:
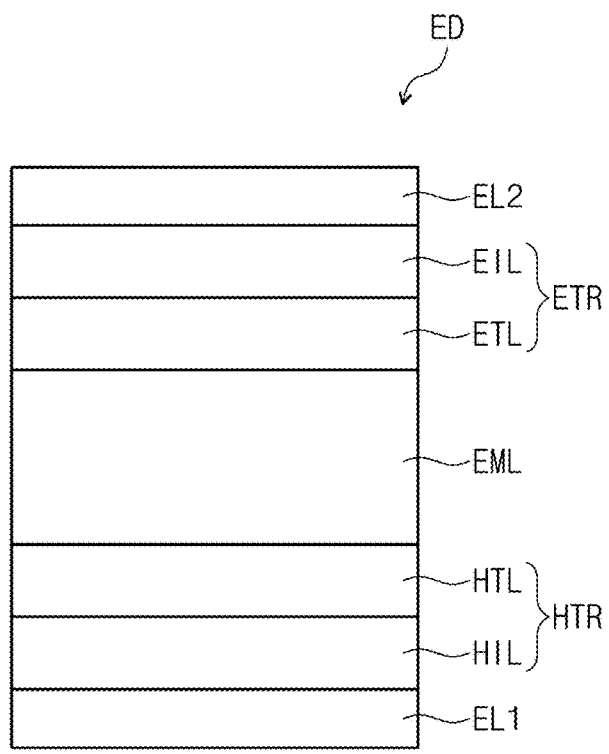
Figure 8:
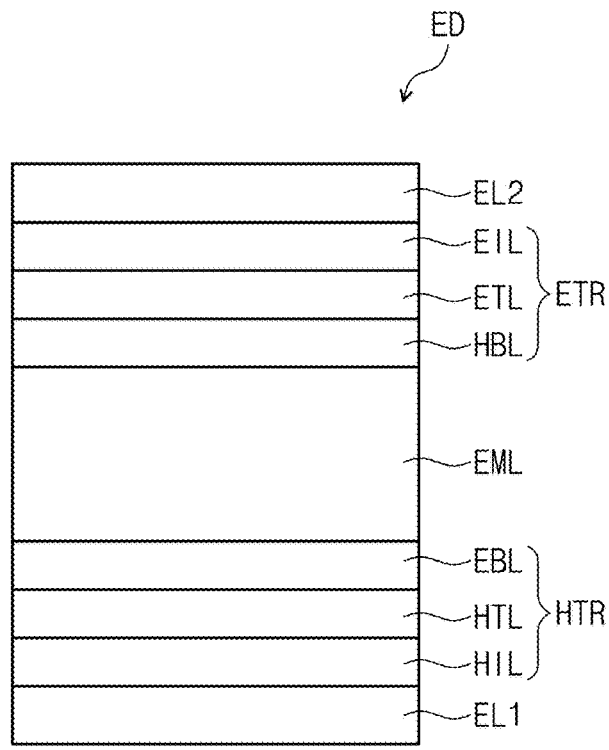
Figure 9:
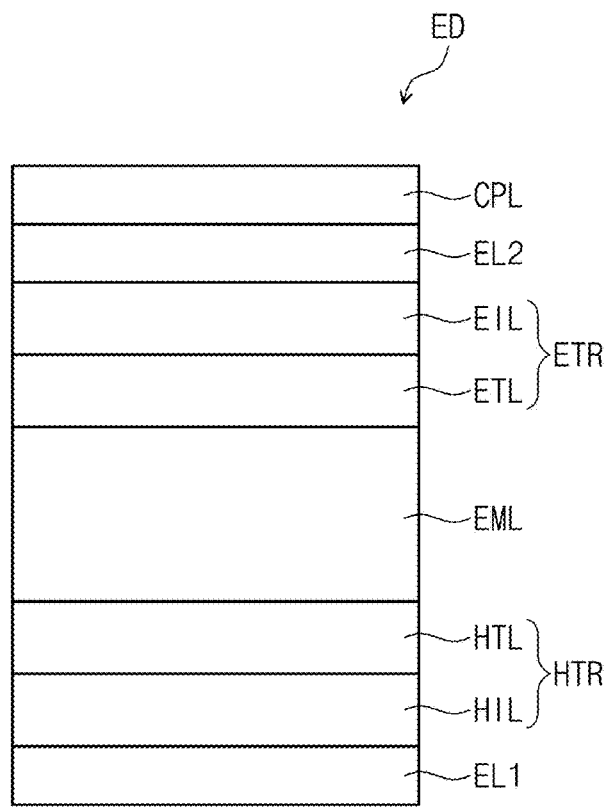

FIG. 7 illustrates, compared with FIG. 6, a cross-sectional view of a light emitting element ED of an embodiment in which the hole transport region HTR includes a hole injection layer HIL and a hole transport layer HTL, and the electron transport region ETR includes an electron injection layer EIL and an electron transport layer ETL. FIG. 8 illustrates, compared with FIG. 6, a cross-sectional view of a light emitting element ED of an embodiment in which the hole transport region HTR includes a hole injection layer HIL, a hole transport layer HTL, and an electron blocking layer EBL, and the electron transport region ETR includes an electron injection layer EIL, an electron transport layer ETL, and a hole blocking layer HBL. FIG. 9 illustrates, compared with FIG. 6, a cross-sectional view of a light emitting element ED of an embodiment including a capping layer CPL disposed on the second electrode EL2.

In the light emitting element ED according to an embodiment, the first electrode EL1 has conductivity. The first electrode EL1 may be formed of a metal alloy or a conductive compound. The first electrode EL1 may be an anode. The first electrode EL1 may be a pixel electrode.

In the light emitting element ED according to an embodiment, the first electrode EL1 may be a reflective electrode. However, embodiments of the present disclosure are not limited thereto. For example, the first electrode EL1 may be a transmissive electrode or a transflective electrode. When the first electrode EL1 is a transflective electrode or a reflective electrode, the first electrode EL1 may include silver (Ag), magnesium (Mg), copper (Cu), aluminum (Al), platinum (Pt), palladium (Pd), gold (Au), nickel (Ni), neodymium (Nd), iridium (Ir), chromium (Cr), lithium (Li), calcium (Ca), LiF/Ca, LiF/Al, molybdenum (Mo), titanium (Ti), a compound thereof, or a mixture thereof (e.g., a mixture of Ag and Mg). In some embodiments, the first electrode EL1 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrode EL1 may be a multilayer metal film and may have a structure in which metal films of ITO/Ag/ITO are stacked.

The hole transport region HTR is provided on the first electrode EL1. The hole transport region HTR may include a hole injection layer HIL, a hole transport layer HTL, etc. In some embodiments, the hole transport region HTR may further include at least one of a hole buffer layer or an electron blocking layer EBL in addition to the hole injection layer HIL and the hole transport layer HTL. The hole buffer layer may compensate for a resonance distance of wavelengths of light emitted from an emission layer EML, and may thus increase luminous efficiency. Materials that may be included in the hole transport region HTR may be included in the hole buffer layer. The electron blocking layer EBL may prevent or reduce electrons from being injected from the electron transport region ETR to the hole transport region HTR.

The hole transport region HTR may have a single layer formed of a single material, a single layer formed of a plurality of different materials, or a multilayer structure having a plurality of layers formed of a plurality of different materials. For example, the hole transport region HTR may have a single-layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in order from the first electrode EL1, but embodiments of the present disclosure are not limited thereto.

The hole transport region HTR may be formed utilizing various suitable methods (such as a vacuum deposition method, a spin coating method, a cast method, a Langmuir-Blodgett (LB) method, an inkjet printing method, a laser printing method, and/or a laser induced thermal imaging (LITI) method).

The hole injection layer HIL, for example, may further include a phthalocyanine compound (such as copper phthalocyanine),N,N'-diphenyl-N,N'-bis-[4-(phenyl-m-tolyl-amino)-phenyl]-biphenyl-4,4'-diamine (DNTPD), 4,4',4"-[tris(3-methylphenyl)phenylamino]triphenylamine] (m-MTDATA), 4,4',4"-tris(N,N-diphenylamino)triphenylamine (TDATA), 4,4',4"-tris{N,-(2-naphthyl)-N-phenylamino)-triphenylamine (2-TNATA), poly(3,4-ethylene dioxythiophene)/poly(4-styrene sulfonate) (PEDOT/PSS), polyaniline/dodecylbenzene sulfonic acid (PANI/DBSA), polyaniline/camphor sulfonic acid (PANI/CSA), polyaniline/poly(4-styrene sulfonate) (PANI/PSS), N,N'-di(naphthalene-1-yl)-N,N'-diphenyl-benzidine (NPD), triphenylamine-containing polyether ketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may include any suitable material in the art. For example, the hole transport layer HTL may further include carbazole-based derivatives (such as N-phenyl carbazole and/or polyvinyl carbazole), fluorene-based derivatives, N,N'-bis(3-methylphenyl)-N,N'-diphenyl-[1,1-biphenyl]-4,4'-diamine (TPD), triphenylamine-based derivatives (such as 4,4',4"-tris(N-carbazolyl) triphenylamine (TCTA)), N,N'-di(naphthalene-1-yl)-N,N'-diphenyl-benzidine (NPD), 4,4'-cyclohexylidene bis[N,N-bis(4-methylphenyl)benzenamine] (TAPC), 4,4'-bis[N,N'-(3-tolyl)amino]-3,3'-dimethylbiphenyl (HMTPD), 1,3-bis (N-carbazolyl)benzene (mCP), etc.

The hole transport region HTR may have a thickness of about 5 nm to about 1,500 nm, for example, about 10 nm to about 500 nm. For example, the hole injection layer HIL may have a thickness of about 3 nm to about 100 nm, the hole transport layer HTL may have a thickness of about 3 nm to about 100 nm, and the electron blocking layer EBL may have a thickness of about 1 nm to about 100 nm. When the thicknesses of the hole transport region HTR, the hole injection layer HIL, the hole transport layer HTL, and the electron blocking layer EBL satisfy the above-described ranges, satisfactory hole transport properties may be obtained without a substantial increase in driving voltage.

The emission layer EML is provided on the hole transport region HTR. The emission layer EML may have, for example, a thickness of about 10 nm to about 100 nm or about 10 nm to about 30 nm. The emission layer EML may have a single layer formed of a single material, a single layer formed of a plurality of different materials, or a multilayer structure having a plurality of layers formed of a plurality of different materials. In the light emitting element ED according to an embodiment, the emission layer EML may include quantum dots QD1, QD2, and QD3 (see FIG. 5).

The emission layer EML may be formed utilizing various suitable methods (such as a vacuum deposition method, a spin coating method, a cast method, a Langmuir-Blodgett (LB) method, an inkjet printing method, a laser printing method, and/or a laser induced thermal imaging (LITI) method). In an embodiment, the emission layer EML may be formed by providing a quantum dot composition including the quantum dots QD1, QD2, and QD3 (see FIG. 5) through inkjet printing.

In the light emitting element ED of an embodiment, the electron transport region ETR is provided on the emission layer EML. The electron transport region ETR may include at least one among a hole blocking layer HBL, an electron transport layer ETL, and an electron injection layer EIL, but embodiments of the present disclosure are not limited thereto.

The electron transport region ETR may be formed of an ink composition according to an embodiment of the present disclosure, which will be described later. For example, the electron transport region ETR may be formed of an ink composition containing inorganic nanoparticles and a first solvent having a Hansen solubility parameter hydrogen bonding term of 5 or less.

When quantum dots are included as an emission layer material or inorganic nanoparticles are utilized as a material for the electron transport region ETR, a solution process (such as spin coating and/or inkjet printing) may be utilized due to the fact that a layer is hardly formed through deposition (e.g., because quantum dots are difficult to deposit using other deposition processes). Depending on an organic solvent utilized in the solution process, the dispersion stability of the inorganic nanoparticles may differ (e.g., may be negatively impacted), and in some cases may cause clogging of a nozzle due to agglomeration, formation of an uneven surface, etc. In an embodiment of the present disclosure, an ink composition for forming the electron transport region ETR may include a first solvent having a Hansen solubility parameter hydrogen bonding term (value) of 5 or less, which may thus increase the dispersion stability of inorganic nanoparticles, thereby preventing or reducing nozzle clogging and forming a substantially uniform thin film, and thus a light emitting element formed using the ink composition may have increased efficiency and/or lifespan. A method for forming the electron transport region ETR will be described in more detail in FIGS. 10 to 14.

The electron transport region ETR may have or be a single layer formed of a single material, a single layer formed of a plurality of different materials, or a multilayer structure having a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, or a hole blocking layer HBL/electron transport layer ETL/electron injection layer EIL are stacked in order from the emission layer EML, but embodiments are not limited thereto. The electron transport region ETR may have a thickness of, for example, about 20 nm to about 150 nm.

When the electron transport region ETR has a multilayer structure having a plurality of layers, any one of the plurality of layers may be formed of an ink composition according to an embodiment of the present disclosure. For example, the electron transport region ETR may include an electron transport layer ETL disposed on the emission layer EML and an electron injection layer EIL disposed on the electron transport layer ETL, and the electron transport layer ETL may be formed of the ink composition of an embodiment.

The electron transport region ETR may be formed utilizing various suitable methods (such as a vacuum deposition method, a spin coating method, a cast method, a Langmuir-Blodgett (LB) method, an inkjet printing method, a laser printing method, a laser induced thermal imaging (LITI) method, etc.). In an embodiment, the electron transport region ETR may be formed and provided through inkjet printing.

The electron transport region ETR may include inorganic nanoparticles. In an embodiment, the inorganic nanoparticles may include at least one among cadmium (Cd), zinc (Zn), indium (In), tin (Sn), antimony (Sb), gallium (Ga), germanium (Ge), arsenic (As), mercury (Hg), nickel (Ni), palladium (Pd), platinum (Pt), cobalt (Co), rhodium (Rh), iridium (Ir), iron (Fe), ruthenium (Ru), osmium (Os), manganese (Mn), molybdenum (Mo), and chromium (Cr), but embodiments of the present disclosure are not limited thereto.

In an embodiment, the inorganic nanoparticles may be zinc oxide. The type or composition of zinc oxide is not particularly limited, but may be, for example, ZnO, ZnMgO, or a combination thereof, and Li and Y may be utilized for doping in addition to Mg. In some embodiments, as inorganic materials other than zinc oxide, $TiO_2$, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$, $ZrSiO_4$, etc. may be utilized, but are not limited thereto.

In an embodiment, the electron transport region ETR may include a suitable inorganic material or a suitable organic material.

When the electron transport region ETR includes the electron transport layer ETL, the electron transport region ETR may include an anthracene-based compound. However, embodiments of the present disclosure are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, Bis[2-(diphenylphosphino)phenyl]ether oxide(DPEPO), 2-(4-(N-phenylbenzoimidazolyl-1-ylphenyl)-9,10-dinaphthylanthracene, 1,3,5-tri (1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato)aluminum (BAlq), beryllium bis(benzoquinolin-10-olate (Bebq₂), 9,10-di(naphthalene-2-yl) anthracene (ADN), or a mixture thereof. The electron transport layers ETL may have a thickness of about 10 nm to about 100 nm, for example, about 15 nm to about 50 nm. When the thickness of the electron transport layers ETL satisfies the above-described ranges, satisfactory electron transport properties may be obtained without a substantial increase in driving voltage.

When the electron transport region ETR includes the electron injection layer EIL, the electron transport region ETR may include a halogenated metal (such as LiF, NaCl, CsF, RbCl, and/or RbI), a lanthanide metal (such as Yb), a metal oxide (such as $Li_2O$ and/or BaO), and/or lithium quinolate (LiQ), etc., but embodiments of the present disclosure are not limited thereto. The electron injection layers EIL may also be formed of a mixture of an electron transport material and an insulating organo-metal salt. For example, the organo-metal salt may include metal acetates, metal benzoates, metal acetoacetates, metal acetylacetonates, and/or metal stearates. The electron injection layer EIL may have a thickness of about 0.1 nm to about 10 nm, for example, about 0.3 nm to about 9 nm. When the thickness of the electron injection layers EIL satisfies the above-described ranges, satisfactory electron injection properties may be obtained without a substantial increase in driving voltage.

As described above, the electron transport region ETR may include a hole blocking layer HBL. The hole blocking layer HBL may include, for example, at least one of 2,9-dimethyl-4,7-diphenyl-1,10-phenanthroline (BCP) or 4,7-diphenyl-1,10-phenanthroline (Bphen), but embodiments of the present disclosure are not limited thereto.

The second electrode EL2 is provided on the electron transport region ETR. The second electrode EL2 may be a common electrode or a cathode. The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (e.g., a mixture of Ag and Mg). In some embodiments, the second electrode EL2 may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc.

In some embodiments, the second electrode EL2 may be connected with an auxiliary electrode. When the second electrode EL2 is connected with the auxiliary electrode, the resistance of the second electrode EL2 may decrease.

Figure 10:
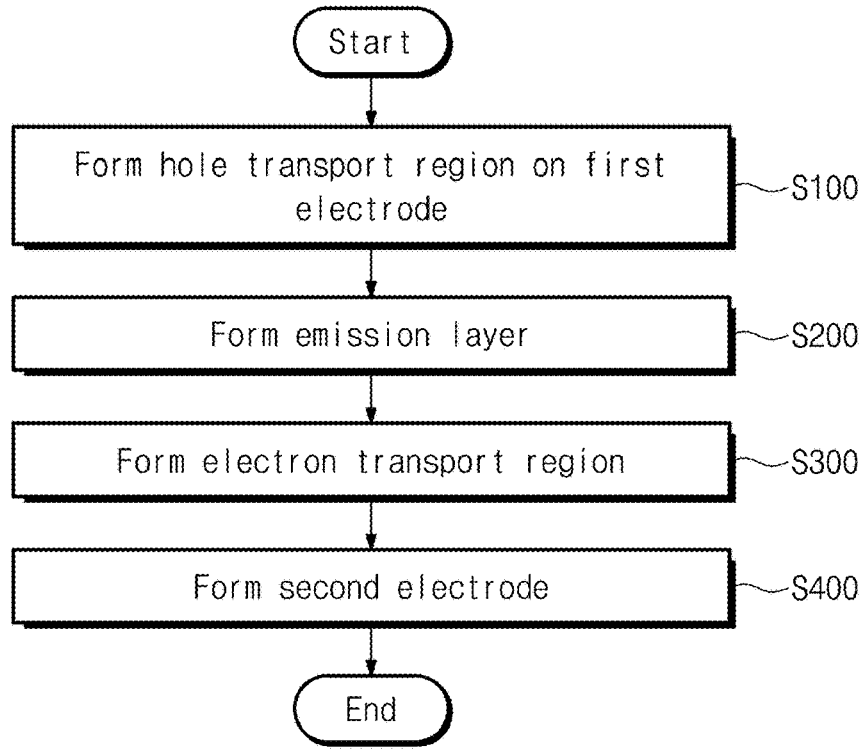
FIG. 10 is a flowchart illustrating a method for manufacturing a light emitting element according to an embodiment.
Figure 11:
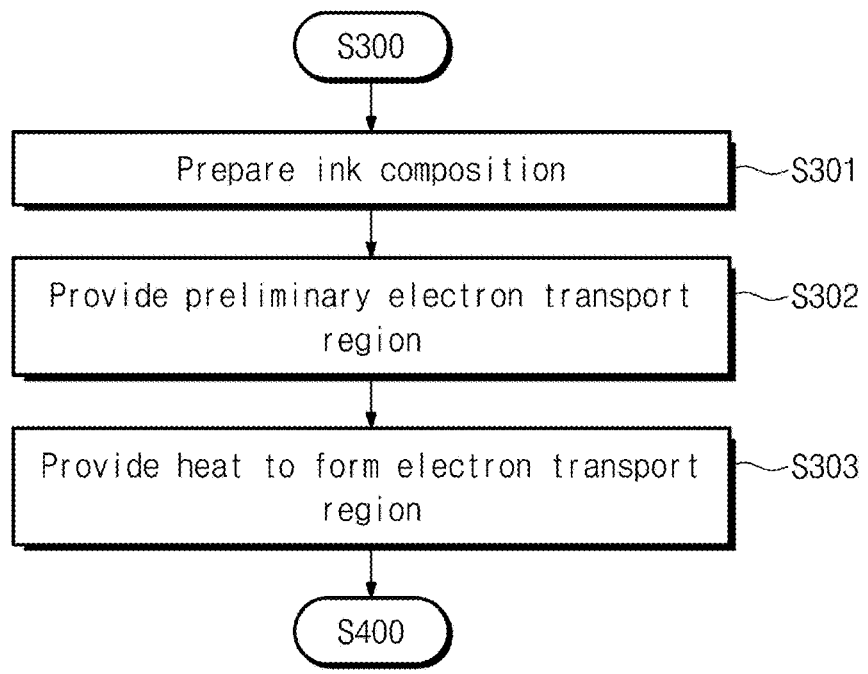
FIG. 11 is a flowchart illustrating the forming of an electron transport region according to an embodiment.

FIG. 10 is a flowchart illustrating a method for manufacturing a light emitting element according to an embodiment. FIG. 11 is a detailed flowchart illustrating the forming of an electron transport region S300 according to an embodiment.

Referring to FIG. 10, a method for manufacturing a light emitting element according to an embodiment includes forming a hole transport region on a first electrode (S100), forming an emission layer on the hole transport region (S200), forming an electron transport region on the emission layer (S300), and forming a second electrode on the electron transport region (S400).

Referring to FIG. 11, the forming of the electron transport region (S300) according to an embodiment includes preparing an ink composition (S301), providing a preliminary electron transport region (S302), and providing heat to form an electron transport region (S303).

Figure 12A:
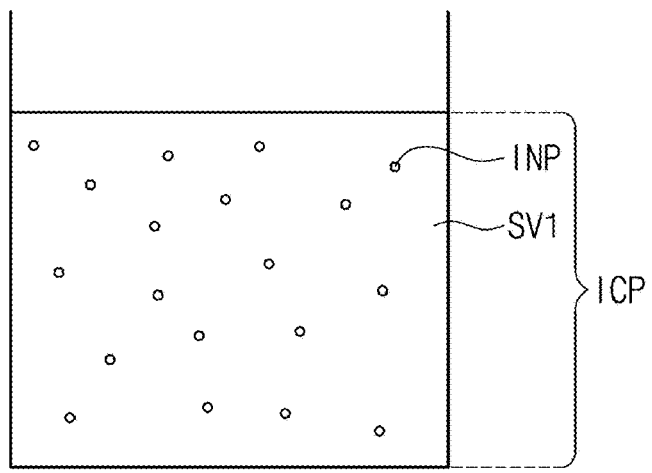
FIGS. 12A-12C are cross-sectional views illustrating an ink composition according to an embodiment.
Figure 12B:
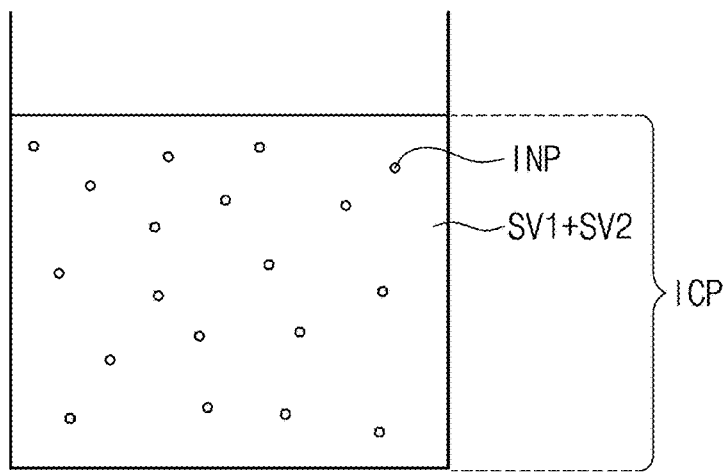
Figure 12C:
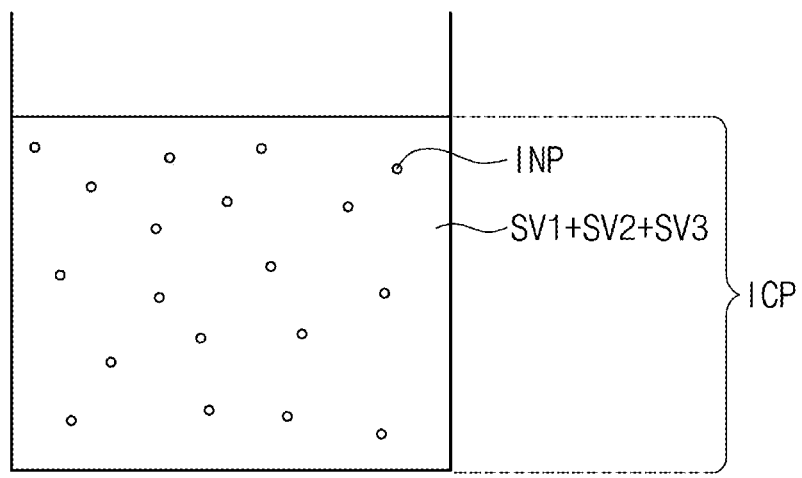

FIGS. 12A to 12C schematically illustrate the preparing of an ink composition in the method for manufacturing a light emitting element according to an embodiment. Hereinafter, an ink composition and the preparing of the same will be described in more detail with reference to FIGS. 12A to 12C.

An ink composition ICP according to an embodiment of the present disclosure may be a material for forming an electron transport region of a light emitting element. However, embodiments of the present disclosure are not limited thereto, and the ink composition ICP of an embodiment may be a material that forms any one of functional layers included in the hole transport region or the emission layer of the light emitting element.

Referring to FIG. 12A, the ink composition ICP according to an embodiment of the present disclosure includes inorganic nanoparticles INP and a first solvent SV1.

In an embodiment, the first solvent SV1 may have, among Hansen solubility parameter values, a hydrogen bonding term ($\delta H$) value of 5 or less. When the hydrogen bonding term value of the Hansen solubility parameter values of the first solvent SV1 satisfies the above-described ranges, agglomeration of the inorganic nanoparticles INP due to moisture penetration may be prevented or reduced, and the inorganic nanoparticles INP may thus have increased dispersion stability. When the first solvent SV1 satisfies the hydrogen bonding term value of the Hansen solubility parameter values, the type or kind of solvent is not particularly limited, and, for example, diisopropyl phthalate may be utilized as the first solvent SV1.

As referenced in the present description, Hansen solubility parameters (HSP) are solubility parameters introduced by Charles M. Hansen and refer to values utilized to predict the solubility of substances (unit: $MPa^{0.5}$). The Hansen solubility parameters may include three parameters $\delta D$, $\delta P$, and $\delta H$. $\delta D$ refers to the energy from dispersion forces between molecules, $\delta P$ refers to the energy from dipole interaction between molecules, and $\delta H$ refers to the energy from hydrogen bonds between molecules.

Hansen solubility parameter values are described in Hansen, Charles M., *Hansen Solubility Parameters; A User's Handbook* (CRC Press, 2007), the entire content of which is incorporated herein by reference, and parameter values of substances that are not described in the document may be estimated utilizing Hansen Solubility Parameters in Practice (HSPiP) software.

In the present description, the dispersion stability of inorganic nanoparticles refers to the ability of stable dispersion (e.g., ability to form a stable dispersion) in a solution without the agglomeration of inorganic nanoparticles over a long period of time.

In the present description, the dispersion stability of the inorganic nanoparticles INP in a solvent may be determined by dispersing the inorganic nanoparticles INP in the solvent to prepare a dispersion, and then checking the particle size of the inorganic nanoparticles INP after 2 weeks or a certain (e.g., set or predetermined) period of time. When the size of the inorganic nanoparticles INP increases by two times or less (e.g., a factor of two or less) after 2 weeks or after a certain period of time, it may be determined that the dispersion stability is high, and when the size of the inorganic nanoparticles INP increases by greater than 2 times (e.g., a factor of greater than two), it may be determined that the dispersibility is low. In some embodiments, the particle size of the inorganic nanoparticles INP may be measured utilizing dynamic light scattering (DLS).

The first solvent SV1 may be a solvent that satisfies the above-described ranges and has high dispersibility for the inorganic nanoparticles INP. In this case, in order to increase dispersibility, an ink composition ICP may be prepared utilizing the first solvent SV1 alone without additionally mixing another solvent.

Referring to FIG. 12B, the ink composition ICP according to an embodiment of the present disclosure may further include a second solvent SV2. The second solvent SV2 may be a solvent capable of well dispersing the inorganic nanoparticles INP. For example, when the dispersibility of the inorganic nanoparticles INP in the first solvent SV1 is low, the dispersibility of the inorganic nanoparticles INP may increase when the second solvent SV2 is further included. In this case, the second solvent SV2 may be appropriately or suitably selected according to types (kinds) of desired or suitable inorganic nanoparticles INP.

In an embodiment, the second solvent SV2 may contain at least one among triethylene glycol monomethyl ether, propylene glycol, and ethyl alcohol, but is not limited thereto.

When the second solvent SV2 is selected (e.g., utilized), the inorganic nanoparticles INP are dispersed in the second solvent SV2 to prepare an inorganic nanoparticle INP dispersion, and the inorganic nanoparticles INP dispersion and the first solvent SV1 may be mixed to prepare an ink composition ICP The hydrogen bonding term ($\delta H$) value of Hansen solubility parameter values of the second solvent may be greater than 5. In this case, the second solvent SV2 may serve to substantially disperse the inorganic nanoparticles INP, and the first solvent SV1 may serve to prevent or reduce moisture from being introduced into an ink by lowering the polarity of a solution. As a result, the dispersion stability of the inorganic nanoparticles INP may be increased to prevent or reduce clogging of a nozzle of inkjet printing and to uniformly form a thin film, thereby increasing the lifespan of a light emitting element. In an embodiment, a volume ratio of the first solvent SV1 to the second solvent SV2 may be about 0.5:1 to about 2:1.

Referring to FIG. 12C, the ink composition ICP according to an embodiment of the present disclosure may further include a third solvent SV3. In an embodiment, the third solvent SV3 may be a material additionally added to lower the polarity of the whole ink composition ICP. For example, as the first solvent SV1, the hydrogen bonding term ($\delta H$) value of the Hansen solubility parameter values of the third solvent SV3 may be 5 or less. Therefore, when the first solvent SV1 and the third solvent SV3 satisfying the above ranges are mixed and utilized, the polarity of the whole ink composition ICP may be lowered, and the inorganic nanoparticles INP may have increased dispersion stability in a solution. In an embodiment, the hydrogen bond term ($\delta H$) value of the Hansen solubility parameter values of the mixed solvent obtained by mixing the first solvent SV1 and the third solvent SV3 may be 3 or less.

In some embodiments, in the ink composition ICP according to an embodiment of the present disclosure, other solvents may be added in addition to the first to third solvents SV1, SV2, and SV3 described above. In this case, the added solvents may have similar physical properties of the first to third solvents SV1, SV2, and SV3, but may have only different physical properties values for correction. For example, the solvents may be solvents serving to correct the surface tension or viscosity of the ink composition ICP.

In an embodiment, the inorganic nanoparticles INP may be about 0.1 mass % to about 10 mass % with respect to a total amount of the ink composition ICP. When the inorganic nanoparticles INP are contained in an amount of less than 0.1 mass %, the inorganic nanoparticles INP may have a low concentration to hardly form a thin film (e.g., may form a thin film with insufficient thickness). When the inorganic nanoparticles INP are contained in an amount of greater than 10 mass %, issues such as an increase in viscosity of a solution, costs for an increase in loading of inorganic nanoparticles, and/or printing speed may be raised.

In an embodiment, the inorganic nanoparticles INP may have a diameter of about 1 nm to about 30 nm. When the size of the inorganic nanoparticles INP satisfies the above ranges, the dispersion stability of the ink composition ICP may be secured, and nozzle clogging in a head (e.g., inkjet printer head) due to the agglomeration of the inorganic nanoparticles INP may be prevented or reduced during the printing process, and uniformity of a thin film in an electron transport region may be secured.

When the diameter of the inorganic nanoparticles INP is less than 1 nm, the inorganic nanoparticles INP may have an increase in surface energy to make the inorganic nanoparticles INP unstable, and accordingly, the inorganic nanoparticles INP may have reduced dispersion stability in the solution and may agglomerate. When the diameter of the inorganic nanoparticles INP is greater than 30 nm, nozzle clogging may be caused in the head, and a thin film is not uniformly formed in thickness, thereby reducing the lifespan of an element.

In the present description, the diameter of the inorganic nanoparticles INP may refer to a size of the inorganic nanoparticles INP after the ink composition ICP is prepared.

In general, the inorganic nanoparticles INP may be prepared to have a particle size of a few nanometers or tens of nanometers. However, when the ink composition ICP is formed by utilizing the same, the inorganic nanoparticles INP may hold (e.g., bind) together to cause agglomeration, and the diameter of the inorganic nanoparticles INP may indicate the effective particle size of the inorganic nanoparticles INP at the agglomeration. The inorganic nanoparticles INP are illustrated as single particles in FIGS. 12A to 12C, but this is presented as an example, and the inorganic nanoparticles INP may form a particle cluster due to agglomeration between particles.

The inorganic nanoparticles INP may have any suitable form commonly utilized in the art, and for example, inorganic nanoparticles INP in the form of spherical, pyramidal, multi-arm, or cubic nanoparticles, nanotubes, nanowires, nanofibers, nanoplates, etc. may be utilized.

Figure 13:
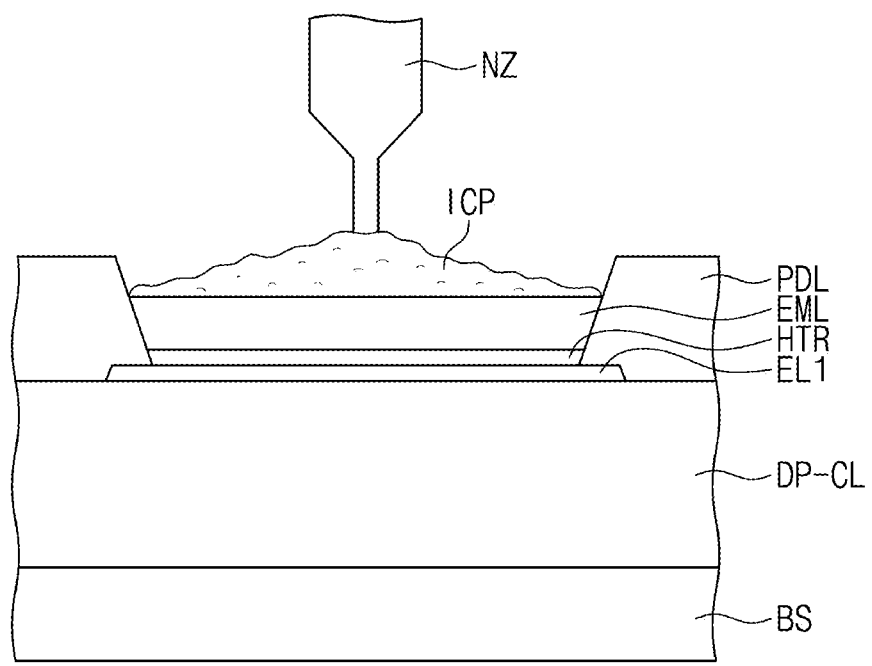
FIG. 13 is a view schematically illustrating forming a preliminary electron transport region according to an embodiment.

FIG. 13 schematically illustrates providing a preliminary electron transport region S300 in the method for manufacturing a light emitting element according to an embodiment. The providing of a preliminary electron transport region S300 refers to applying the ink composition ICP onto the emission layer EML.

In an embodiment, a method for the applying of the ink composition ICP on the emission layer EML may be inkjet printing. For example, the electron transport region ETR may be formed through inkjet printing. However, embodiments of the present disclosure are not limited thereto, and the electron transport region ETR may be formed utilizing methods such as a vacuum deposition method, a spin coating method, a cast method, a Langmuir-Blodgett (LB) method, a laser printing method, and/or a laser induced thermal imaging (LITI) method. FIG. 13 illustrates that the ink composition ICP is applied between regions of the pixel defining film PDL through a nozzle NZ, but embodiments are not limited thereto.

Figure 14:
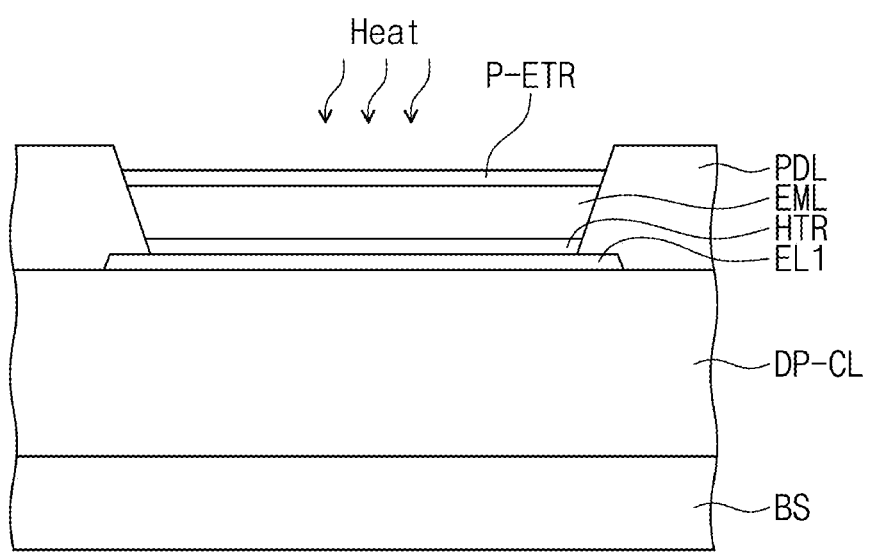
FIG. 14 is a view schematically illustrating forming an electron transport region according to an embodiment.

FIG. 14 is a view schematically illustrating forming an electron transport region by providing heat in the method for manufacturing a light emitting element according to an embodiment. The providing of heat to a preliminary electron transport region P-ETR according to an embodiment may refer to providing heat of about 120° C. to about 180° C. to the preliminary electron transport region P-ETR for 20 minutes or more to cure the preliminary transport region P-ETR.

The ink composition according to an embodiment of the present disclosure may increase dispersion stability of inorganic nanoparticles, and thus prevent or reduce nozzle clogging in an inkjet printing device.

When an electron transport region having inorganic nanoparticles as an electron transport material is prepared, the inorganic nanoparticles may be dispersed in one or more suitable types (kinds) of organic solvents. In this case, a difference in the dispersion stability of the ink composition is generated depending on added solvents, and when the dispersion stability is low to cause agglomeration between the inorganic nanoparticles or denature the solvent during storage, nozzle clogging in the head may be caused during the printing process.

According to an embodiment of the present disclosure, the ink composition in which the inorganic nanoparticles are dispersed contains a first solvent having a Hansen solubility parameter hydrogen bonding term value of 5 or less to prevent or reduce inorganic nanoparticle agglomeration due to moisture penetration, thereby increasing the dispersion stability and preventing or reducing nozzle clogging in the head during the printing process. When the electron transport region is formed by utilizing the ink composition, the ink composition serves to help the inorganic nanoparticles to be uniformly applied, thereby increasing the efficiency of the light emitting element.

Hereinafter, embodiments of the present disclosure will be described in more detail through Examples and Comparative Examples. The examples shown are provided only for the understanding of the present disclosure, and the scope of the present disclosure is not limited thereto.

1. Measurement of Hansen Solubility Parameter Values of Solvents

The Hansen solubility parameter values of the solvents utilized in Examples and Comparative Examples were measured and are shown in Table 1. The Hansen solubility parameter values were checked utilizing the HSPiP software program.

TABLE 1

|  | δHSP | δD | δP | δH |
|---|---|---|---|---|
| Diisopropyl phthalate | 18.8 | 17.2 | 7.1 | 2.8 |
| Trimethylene glycol monomethyl ether | 21.8 | 16.2 | 7.6 | 12.5 |
| Triamyl phosphate | 18.1 | 16.1 | 6.6 | 5.1 |

2. Preparation of Ink Compositions of Examples and Comparative Examples

Example 1

Using trimethylene glycol monomethyl ether as a second solvent, zinc oxide (ZnO) nanoparticles were dispersed in the second solvent at 3 wt % to obtain an inorganic nanoparticle dispersion. Thereafter, utilizing diisopropyl phthalate as a first solvent, diisopropyl phthalate was additionally mixed with the inorganic nanoparticle dispersion such that a volume ratio of the first solvent to the second solvent was 0.5:1 to prepare an ink composition.

Example 2

An ink composition was prepared in substantially the same manner as in Example 1, except that the volume ratio of the first solvent to the second solvent was 1:1.

Example 3

An ink composition was prepared in substantially the same manner as in Example 1, except that the volume ratio of the first solvent to the second solvent was 2:1.

Comparative Example 1

An ink composition was prepared in substantially the same manner as in Example 1, except that trimethylene glycol monomethyl ether was utilized as the first solvent.

Comparative Example 2

An ink composition was prepared in substantially the same manner as in Example 1, except that trimethylene glycol monomethyl ether was utilized as the first solvent, and the volume ratio of the first solvent to the second solvent was 1:1.

Comparative Example 3

An ink composition was prepared in substantially the same manner as in Example 1, except that trimethylene glycol monomethyl ether was utilized as the first solvent, and the volume ratio of the first solvent to the second solvent was 2:1.

Comparative Example 4

An ink composition was prepared in substantially the same manner as in Example 1, except that triamyl phosphate was utilized as the first solvent.

Comparative Example 5

An ink composition was prepared in substantially the same manner as in Example 1, except that triamyl phosphate was utilized as the first solvent, and the volume ratio of the first solvent to the second solvent was 1:1.

Comparative Example 6

An ink composition was prepared in substantially the same manner as in Example 1, except that triamyl phosphate was utilized as the first solvent, and the volume ratio of the first solvent to the second solvent was 2:1.

3. Evaluation of Dispersion Stability of Inorganic Nanoparticles

In order to evaluate the dispersion stability of inorganic nanoparticles, the ink compositions of Examples and Comparative Examples each were stored at room temperature for 24 hours, the particle sizes were measured utilizing dynamic light scattering (DLS), and the results are shown in Table 2. The dynamic light scattering was performed utilizing a Zetasizer Nano ZS90 from Malvern Panalytical.

TABLE 2

|  | First solvent | Second solvent | First solvent: Second solvent | Particle size (nm) |
|---|---|---|---|---|
| Example 1 | Diisopropyl phthalate | Trimethylene glycol monomethyl ether | 0.5:1 | 26.3 |
| Example 2 |  |  | 1:1 | 11.1 |
| Example 3 |  |  | 2:1 | 9.2 |
| Comparative Example 1 | Trimethylene glycol monomethyl ether |  | 0.5:1 | 223 |
| Comparative Example 2 |  |  | 1:1 | 216 |
| Comparative Example 3 |  |  | 2:1 | 266 |
| Comparative Example 4 | Triamyl phosphate |  | 0.5:1 | 210 |
| Comparative Example 5 |  |  | 1:1 | 198 |
| Comparative Example 6 |  |  | 2:1 | 205 |

Referring to Table 1 above, it is seen that the inorganic nanoparticles of Examples 1 to 3 had excellent or suitable dispersion stability in the ink compositions, and accordingly, agglomeration of the inorganic nanoparticles was prevented or reduced. In particular, it is seen that with an increase in the volume ratio of the first solvent to the second solvent, an increase in particle size tended to be more prevented or reduced (e.g., was more limited).

On the other hand, in Comparative Examples 1 to 3, trimethylene glycol monomethyl ether (which is the second solvent) was also utilized as the first solvent (e.g., a single solvent was used), and did not have a Hansen solubility parameter hydrogen bonding term value of 5 or less was not utilized, and thus, compared to Examples 1 to 3, the agglomeration of the inorganic nanoparticles increased due to easier moisture penetration.

In Comparative Examples 4 to 6, trimethylene glycol monomethyl ether was utilized as the second solvent, and triamyl phosphate having, among Hansen solubility parameter values, a hydrogen bonding term value of greater than 5 was utilized as the first solvent, and thus, when compared to Examples 1 to 3, it is seen that the dispersion stability of the inorganic nanoparticles was reduced due to easier moisture penetration into the composition during storage.

Figure 15A:
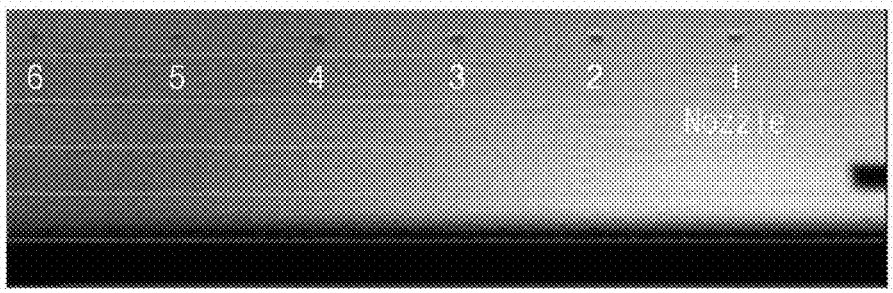
FIGS. 15A-15D are images showing nozzles in a head of an inkjet printing device according to an embodiment.
Figure 15B:
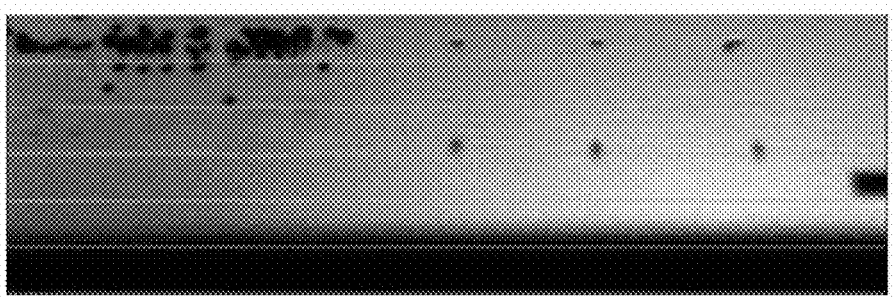
Figure 15C:
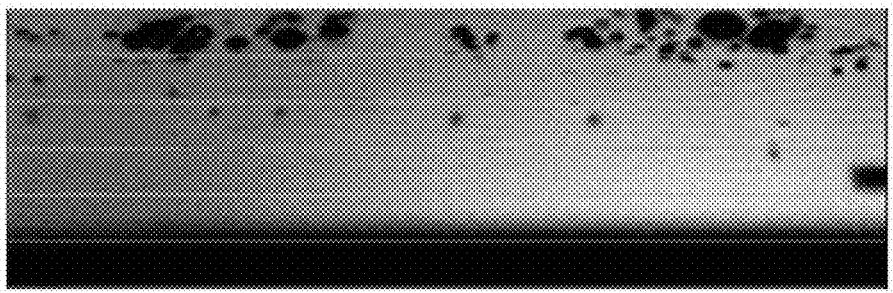
Figure 15D:
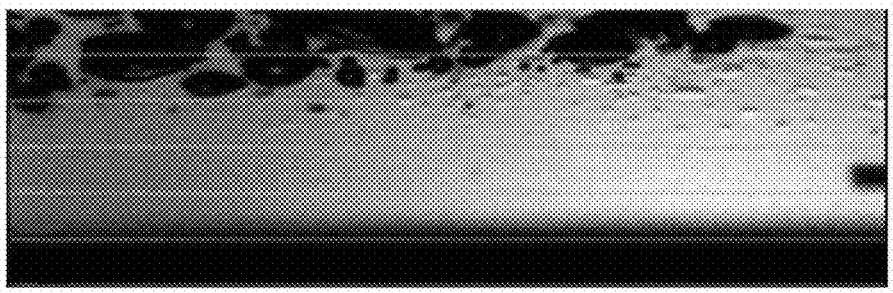

FIGS. 15A to 15D are photographic images showing a plurality of nozzles in an inkjet head of an inkjet printing device, showing states of the nozzles over time after the process was performed utilizing Comparative Example 1. FIGS. 15A and 15B show the states of the nozzles prior to printing (e.g., 0 minutes), 5 minutes, 15 minutes, and 30 minutes after the start of the process, respectively. In FIG. 15A, 1 to 6 indicate nozzle numbers for convenience of description.

Referring to FIG. 15A, it is seen that all of the nozzles 1 to 6 right before the start of the inkjet process were not clogged. On the other hand, referring to FIGS. 15B to 15D, agglomeration of the inorganic nanoparticles occurred 5 minutes after the start of the process, and the nozzles 4 to 6 started to be clogged, and the entire nozzles (e.g., all of nozzles 1 to 6) were clogged after 30 minutes.

Figure 16:
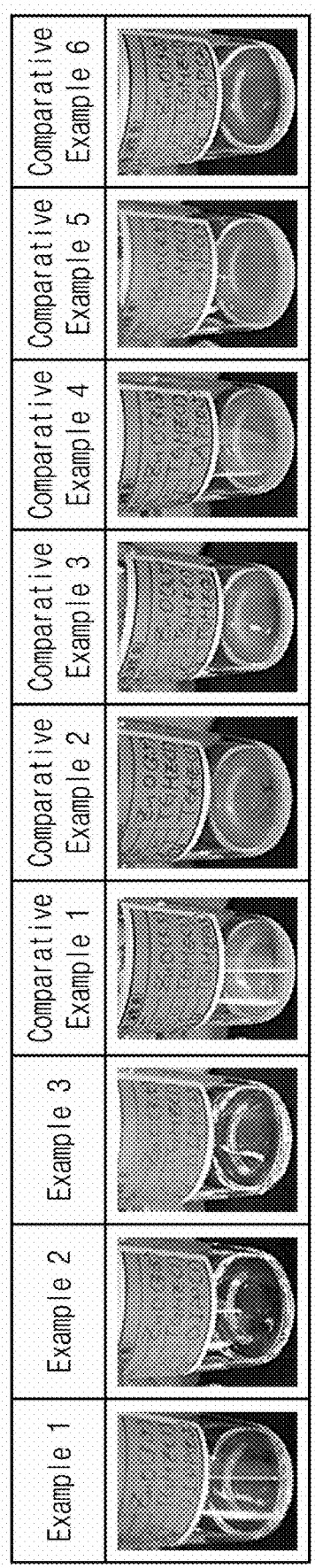
FIG. 16 shows visual check (e.g., photographic) images of ink compositions of Examples and Comparative Examples according to an embodiment.

FIG. 16 is a view showing visual check images (photographs) of each of the ink compositions of Examples and Comparative Examples after storage at room temperature for 25 hours. It is seen that Examples 1 to 3 all exhibited higher transparency than Comparative Examples 1 to 6.

In contrast, it is seen that Comparative Examples 1 to 6 exhibited a milky-white suspension due to strong agglomeration between the inorganic nanoparticles when compared to Examples. For example, it is seen that utilizing the second solvent alone or utilizing a first solvent having, among Hansen solubility parameter values, a hydrogen bonding term value of greater than 5 lowers the dispersion stability of the inorganic nanoparticles to cause the agglomeration of the nanoparticles.

According to an ink composition according to an embodiment of the present disclosure, a low polarity solvent having a small hydrogen bonding term value among Hansen solubility parameter values is included, and dispersion stability of inorganic nanoparticles in a solution may thus increase.

According to a method for manufacturing a light emitting element according to an embodiment of the present disclosure, an ink composition having increased dispersion stability is applied, and nozzle clogging in a head during an inkjet printing process may thus be prevented or reduced.

As used herein, the terms "substantially," "about," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although embodiments of the present disclosure have been described above with reference to the accompanying drawings, those skilled in the art to which the present disclosure pertains may implement the present disclosure in other forms without changing the technical idea or essential features thereof. Therefore, it should be understood that the embodiments described above are not restrictive, and that various changes in form and details may be made therein without departing from the spirit and scope of the present disclosure as set forth in the following claims and their equivalents.

What is claimed is:

1. An ink composition comprising:
   a plurality of inorganic nanoparticles;
   a first solvent; and
   a second solvent,
   wherein a volume ratio of the first solvent to the second solvent is about 0.5:1 to about 2:1,
   wherein the first solvent comprises diisopropyl phthalate,
   wherein the first solvent has a Hansen solubility parameter hydrogen bonding term (δH) value of 5 or less.

2. The ink composition of claim 1, wherein the second solvent contains at least one selected from triethylene glycol monomethyl ether, propylene glycol, and ethyl alcohol.

3. The ink composition of claim 1, wherein the plurality of inorganic nanoparticles are in an amount of about 0.1 mass % to about 10 mass % with respect to a total amount of 100 mass % of the ink composition.

4. The ink composition of claim 1, wherein the plurality of inorganic nanoparticles comprise at least one selected from Cd, Zn, In, Sn, Sb, Ga, Ge, As, Hg, Ni, Pd, Pt, Co, Rh, Ir, Fe, Ru, Os, Mn, Mo, and Cr.

5. The ink composition of claim 1, wherein the plurality of inorganic nanoparticles have an average diameter of about 1 nm to about 30 nm.

6. The ink composition of claim 2, further comprising a third solvent, wherein the third solvent has a Hansen solubility parameter hydrogen bonding term (δH) value of 5 or less.

7. The ink composition of claim 6, wherein a mixture of the first solvent and the third solvent has a Hansen solubility parameter hydrogen bonding term ($\delta H$) value of 3 or less.

* * * * *